United States Patent
Kim et al.

(10) Patent No.: US 9,306,308 B2
(45) Date of Patent: Apr. 5, 2016

(54) SURFACE-MOUNT TYPE ELECTRIC CONNECTING TERMINAL, AND ELECTRONIC MODULE UNIT AND CIRCUIT BOARD USING THE SAME

(71) Applicants: JOINSET CO., LTD., Ansan-si, Kyeonggi-do (KR); Sun-Ki Kim, Gunpo-si, Kyeonggi-do (KR)

(72) Inventors: Sun-Ki Kim, Gunpo-si (KR); Tae-Man Kang, Ansan-si (KR)

(73) Assignees: Joinset Co., Ltd. (KR); Sun-ki Kim (KR)

( * ) Notice: Subject to any disclaimer, the term of this patent is extended or adjusted under 35 U.S.C. 154(b) by 1 day.

(21) Appl. No.: 14/315,673

(22) Filed: Jun. 26, 2014

(65) Prior Publication Data

US 2015/0133000 A1    May 14, 2015

(30) Foreign Application Priority Data

Nov. 14, 2013 (KR) .......... 10-2013-0138676
Apr. 11, 2014 (KR) .......... 10-2014-0043738
Apr. 18, 2014 (KR) .......... 10-2014-0046947

(51) Int. Cl.
| | | |
|---|---|---|
| H01R 13/24 | (2006.01) | |
| H01R 4/02 | (2006.01) | |
| H01R 12/57 | (2011.01) | |
| H01R 12/71 | (2011.01) | |
| H05K 3/34 | (2006.01) | |

(52) U.S. Cl.
CPC ............ *H01R 13/2428* (2013.01); *H01R 4/028* (2013.01); *H01R 13/2421* (2013.01); *H01R 12/57* (2013.01); *H01R 12/718* (2013.01); *H05K 3/341* (2013.01); *H05K 2201/1031* (2013.01); *Y02P 70/611* (2015.11)

(58) Field of Classification Search
CPC ........... H01R 13/2421; H01R 2101/00; H01R 13/2428
USPC .................................................. 439/824, 700
See application file for complete search history.

(56) References Cited

U.S. PATENT DOCUMENTS

| | | | | |
|---|---|---|---|---|
| 5,641,315 | A * | 6/1997 | Swart ................. | G01R 1/06722 324/72.5 |
| 6,957,986 | B2 * | 10/2005 | Jing ................... | H01R 13/2421 439/700 |
| 7,682,206 | B2 * | 3/2010 | Kainz ................. | H01R 13/187 439/700 |
| 7,955,140 | B1 | 6/2011 | Lin et al. | |
| 2004/0127106 | A1 | 7/2004 | Sekiguchi | |

FOREIGN PATENT DOCUMENTS

| | | |
|---|---|---|
| CN | 201889752 U | 7/2011 |
| JP | 10-284158 A | 10/1998 |
| KR | 20-0332757 Y1 | 11/2003 |
| KR | 10-2004-0073256 A | 8/2004 |

* cited by examiner

*Primary Examiner* — Phuong Dinh
(74) *Attorney, Agent, or Firm* — Park & Associates IP Law, P. C.

(57) ABSTRACT

Provided is a surface-mount type electric connecting terminal which is disposed between opposing conductive objects and is configured to electrically connecting the objects while easily adjusting pressing force and recovery force. The electric connecting terminal includes a cylindrical fixed member which is made from a metallic material; a cylindrical movable member which is slidably inserted in the fixed member and is made from a metallic material; and an electrical conductive spring which is accommodated in the fixed member and whose one end contacts with the bottom of the fixed member and the other end contacts with the bottom of the movable member for thereby allowing the movable member to elastically slide against the fixed member.

18 Claims, 18 Drawing Sheets

SURFACE-MOUNT TYPE ELECTRIC CONNECTING TERMINAL, AND ELECTRONIC MODULE UNIT AND CIRCUIT BOARD USING THE SAME

REFERENCE TO RELATED APPLICATIONS

This application claims the priority benefit of Korean Patent Application No. 10-2013-0138676 filed on Nov. 14, 2013, Korean Patent Application No. 10-2014-0043738 filed on Apr. 11, 2014, and Korean Patent Application No. 10-2014-0046947 filed on Apr. 18, 2014, the entire contents of which are incorporated herein by reference.

FIELD OF THE INVENTION

The present invention relates to a surface-mount type electric connecting terminal, and more particularly, to a surface-mount type electric connecting terminal which is disposed between opposing conductive objects to electrically connect the objects to each other with high reliability and easily adjusts pressing force and recovering force.

Furthermore, the present invention relates to a surface-mount type electric connecting terminal which makes it possible to minimize the delaminating and leaning during soldering, obtain a longer operating distance as compared with the height of a product, reduce manufacturing costs, and produce reliable products.

BACKGROUND OF THE INVENTION

In order to electrically connect a conductive object such as an antenna to a conductive pattern of a printed circuit board or to electrically connect to the ground for eliminating static electricity or electromagnetic interference (EMI), there is provided an elastic connecting terminal mounted on a conductive pattern of a printed circuit board by soldering.

In case that the electric connecting terminal is used for connecting electricity in up and down directions so as to compensate for a vertical dimensional tolerance between a printed circuit board and a conductive object which will be electrically connected, the electric connecting terminal needs to have a longer operating distance in up and down directions and needs to be made from a predetermined material in a structure in which a soldering mounting may be available by a surface-mount method for mass production.

For example, if a mechanical tolerance between the printed circuit board and the conductive object becomes larger, a longer operating distance of the electric connecting terminal is necessary so as to electrically connect the printed circuit board to the conductive object.

As disclosed in the Korean Utility Model Registration No. 332757 invented by the same applicant, there is provided a conductive gasket in which each of metallic sheets is made as a cylinder of which one side is closed and the other side is open, and the other sides of the cylinders which are open are slidably inserted into each other, and a metallic spring is inserted inside in such a way that the metallic spring is not disengaged.

However, since it does not need to fix such a metallic spring to a metallic sheet such that the metallic spring is temporarily fixed so as to keep the metallic spring before a reflow process or such that the metallic spring is maintained in a simple inserted state, a vacuum pickup process may be hard for the sake of surface-mounting work.

The top cylinder may be disengaged and taken off by blowing hot air when reflow-soldering the bottom cylinder onto the printed circuit board because the metallic sheet and the metallic spring are not surely coupled to each other.

In addition, the top cylinder may be disengaged and taken off by recovery force of the spring when the objects move during the use of the gasket.

Since there is not any assistant portion to hold the spring in place within the top and bottom cylinders, the inner spring may be distorted during compression.

In the related art, there is a pogo pin which is widely used when electrically inspecting a printed circuit board or a semiconductor chip or which is used in medical equipment, more specifically, in obesity or skin treatment equipment. The photos illustrated in FIG. 1A is an example to which the pogo pin is adapted.

Referring to FIG. 1B which illustrates a schematic structure of a pogo pin, a plunger 60 is inserted in a case 50 with a spring 70 inserted therebetween and elastically moves in up and down directions.

Here, the pogo pin has a predetermined height of about 3 mm or more, which however entails increasing the height of the fixed member so as to obtain enough operating distance in up and down directions because a guide portion 64 of the plunger 60 inserted in the case 50 should be longer so as to balance the relatively large plunger 60 as illustrated in FIG. 1B. In this reason, it is hard to economically manufacture the products whose heights are about 2 mm or more and operating distances are longer.

The above-described problems occur because it was not considered to independently solder the pogo pin onto the printed circuit board at initial stages. The pogo pin is generally used in a state where the pogo is assembled to a mould.

For this reason, it is hard to provide a pogo pin which has a low height and a long operating distance in up and down directions, and it is hard to mount the pogo pin onto a printed circuit board using a reel tape through a reflow soldering process using vacuum pickup and solder cream.

Since a top surface 62 of the plunger 60 of the pogo pin is formed in a dome shape, the vacuum pickup for surface-mounting is performed hard.

Since the plunger 60 of the pogo pin is manufactured by cutting a typical metal, manufacturing costs is a lot, and there is a limit in making the plunger 60 thinner.

Since the plunger 60 manufactured by cutting metal is heavier than the case 50, the center of gravity may lean in an upward direction, which causes more movement (swaying) by hot air during the reflow soldering process.

SUMMARY OF THE INVENTION

An object of the present invention is to provide a surface-mount type electric connecting terminal which has a structure configured for easier reflow soldering by a vacuum pickup.

Another object of the present invention is to provide a surface-mount type electric connecting terminal which has a lower height and a longer operating distance.

A further another object of the present invention is to provide a surface-mount type electric connecting terminal which may be easily manufactured and has low manufacturing cost.

A further another object of the present invention is to provide a surface-mount type electric connecting terminal which is hardly disengaged during an engagement for soldering or after soldering.

A further another object of the present invention is to provide a surface-mount type electric connecting terminal which makes it possible to minimize electric resistance or electric contact resistance.

A further another object of the present invention is to provide a surface-mount type electric connecting terminal which allows an inside spring not to be easily distorted by the movement of objects.

A further another object of the present invention is to provide a surface-mount type electric connecting terminal which makes it possible to enhance the reliability of soldering since the delaminating or leaning does not occur during a reflow soldering which is performed using solder cream by a vacuum pickup.

A further another object of the present invention is to provide a surface-mount type electric connecting terminal which has a higher height as compared with the surface area of its bottom, whereby the surface-mount type terminal may be easily applied to a product which has a small surface area along with reliable soldering.

A further another object of the present invention is to provide a surface-mount type electric connecting terminal which makes it possible to enhance soldering strength during reflow soldering which is performed using solder cream in a vacuum pickup process.

According to an aspect of the present invention, there is provided a surface-mount type electric connecting terminal, comprising a cylindrical fixed member which is made from a metallic material; a cylindrical movable member which is slidably inserted in the fixed member and is made from a metallic material; and an electrical conductive spring which is accommodated in the fixed member and whose one end contacts with a bottom of the fixed member and the other end contacts with a bottom of the movable member for thereby allowing the movable member to elastically slide against the fixed member, wherein the movable member and the fixed member always keep electrically connected by the electrical conductive spring, and a hook portion is configured to prevent the movable member from being disengaged from the fixed member when elastic recovery force is transferred from the electrical conductive spring, and a flat surface is formed in the surface of the other end of the movable member for the sake of vacuum pickup, and the surface of the other end of the fixed member is configured to be reflow-soldered using solder cream.

Preferably, the hook portion may comprise a hook protrusion formed by inwardly bending an edge of an opening of the fixed member; and a flange which extends outward in a horizontal direction along an edge of an opening of the movable member, wherein the thickness of the flange corresponds to the thickness of the movable member.

Preferably, the width of the flange may be determined such that the movable member may not be disengaged from the fixed member even by elastic recovery force of the spring because the movable member is caught by the hook protrusion, and is determined such what a gap between a cross section of the flange and an inner surface of the fixed member may be maintained as large as possible.

Preferably, the hook protrusion may be slanted in an upward direction or a downward direction from an edge of the fixed member.

Preferably, the total weight of the fixed member is determined to be heavier than the total weight of the movable member, so the center of gravity of the electric connecting terminal is positioned in the fixed member.

Preferably, the surface area of the lower end surface of the fixed member may be larger than the surface area of the upper end surface of the movable member.

Preferably, the corners of the lower end surface of the fixed member and the upper end surface of the movable member may be rounded.

Preferably, the lower end surface of the fixed member may be slanted in an upward direction from the edge to the center for thereby having a recess.

Preferably, a groove may be formed at the center of the lower end surface of the fixed member, and an embossing protrudes in an inward direction from the bottom of the fixed member.

Preferably, the embossing may be inserted in the other end of the spring.

Preferably, the spring has at least a larger diameter portion which contacts along an edge of the bottom of the fixed member.

Preferably, a non-soldering region where soldering using a solder cream is hard may be formed in the lower end surface of the fixed member, and the non-soldering region is coated with heat-resisting polymer resin.

Preferably, the non-soldering region may be formed in a circular shape in a central portion of the lower end surface of the fixed member.

Preferably, the spring is manufactured by winding multiple turns a metallic wire which has electrical conductivity, with each of the turns being spaced apart from one another so as to obtain elastic force in a vertical direction.

Preferably, the heights of the fixed member and the movable member are similar or same.

Preferably, the fixed member and the movable member both are press process-based products manufactured in such a way to press metallic sheets through a press process.

Preferably, the fixed member and the movable member are formed in cylindrical shapes or elliptical cylinder shapes.

Preferably, the height of the electric connecting terminal is 0.5 mm to 3 mm, and in case that the fixed member is a cylindrical shape, the diameter of the cross section in a horizontal direction is below 3 mm.

Preferably, the electric resistances in the vertical direction of the electric connecting terminal is approximately 0.5 ohm or less before pressing, and decrease as the movable member is gradually pressed.

Preferably, the electric connecting terminal is reel taped on a carrier or is aligned on a palate.

Preferably, the electric connecting terminal is mounted by a vacuum pickup and is reflow-soldered using a solder cream and is surface-mounted on a printed circuit board.

Preferably, in the electric connecting terminal, a filler which has elasticity and heat resistance satisfying the temperature condition of the reflow soldering is filled.

Preferably, the fixed member and the movable member both are longer than the widths thereof and each comprise a narrow width portion formed in each center and a pair of wide width portions which are integrate at both sides of the narrow width portion and have wider widths than the narrow width portion, and the spring is housed in each wide width portion.

Preferably, the fixed member and the movable member both are longer than the widths thereof and each comprise a wide width portion formed in each center and a pair of narrow width portions which are integrate at both sides of the wide width portion and have smaller widths than the wide width portion, and the spring is housed in each wide width portion.

Preferably, the fixed member and the movable member both are longer than the widths thereof and each comprise a wide width portion and a narrow width portion which is integrate at one side of the wide width portion and has smaller width than the wide width portion, and the spring is housed in each wide width portion.

According to another aspect of the present invention, there is provided a surface-mount type electric connecting terminal, comprising a box-shaped fixed member which is made from a metallic material; a box-shaped movable member which is slidably inserted in the fixed member and is made from a metallic material; and an electrical conductive flat spring which is accommodated in the fixed member and whose one end contacts with the bottom of the fixed member and the other end contacts with the bottom of the movable member for thereby allowing the movable member to elastically slide against the fixed member, wherein the movable member and the fixed member always keep electrically connected by the electrical conductive flat spring, and a hook portion is configured to prevent the movable member from being disengaged from the fixed member when elastic recovery force is transferred from the electrical conductive flat spring, and a flat surface is formed in the surface of the other end of the movable member for the sake of vacuum pickup, and the surface of the other end of the fixed member is configured to be reflow-soldered using solder cream.

Preferably, the electrical conductive flat spring comprises a pair of contact portions which contact with the bottom of the fixed member and the bottom of the movable member, and an elastic transformation portion which is disposed between the pair of the contact portions and is configured to connect the pair of the contact portions and is elastically transformed by external pressure.

Preferably, the electrical conductive flat spring has any of a Z-shaped cross section shape, a C-shaped cross section shape, a pair of opposing Σ-shaped cross section shapes and a vertical cross section of a bent strip.

Preferably, a boundary between the contact portion and the elastic transformation portion may be bent with a predetermined curvature or may have a predetermined included angle.

Preferably, the width and length of each contact portion are same as or shorter that the width and length of the bottom of the movable member.

According to another aspect of the present invention, there is provided an electronic module unit disposed and fixed to a housing of electronic equipment and comprising an electronic device coupled to a structure, the electronic module unit comprising: at least one conductive input/output pad disposed on the structure, the at least one conductive input/output pad being electrically connected to the electronic device; and an elastic electric connecting terminal mounted on the conductive input/output pad through soldering, wherein the electric connecting terminal comprises: a cylindrical metallic fixed member mounted on the conductive pattern through reflow soldering using a solder cream; a cylindrical metallic movable member having a top surface on which an area for vacuum pickup is defined, the movable member being inserted into and slidably coupled to the fixed member; and a metallic spring accommodated into the fixed member, the spring having one end contacting with a bottom of the fixed member and the other end contacting with a bottom of the movable member so that the movable member is elastically slid with respect to the fixed member, wherein the movable member and the fixed member are electrically connected always to each other by the spring, and a hook portion prevent the movable member from being separated from the fixed member by an elastic restoring force applied to the movable member.

According to another aspect of the present invention, there is provided an electronic module unit disposed and fixed to a housing of electronic equipment and comprising an electronic device coupled to a structure, the electronic module unit comprising: at least one conductive input/output pad disposed on the structure, the at least one conductive input/output pad being electrically connected to the electronic device; and an elastic electric connecting terminal mounted on the conductive input/output pad through soldering, wherein the electric connecting terminal comprises: a box-shaped metallic fixed member mounted on the conductive pattern through reflow soldering using a solder cream; a box-shaped metallic movable member having a top surface on which an area for vacuum pickup is defined, the movable member being inserted into and slidably coupled to the fixed member; and a metallic flat spring accommodated into the fixed member, the flat spring having one end contacting with a bottom of the fixed member and the other end contacting with a bottom of the movable member so that the movable member is elastically slid with respect to the fixed member, wherein the movable member and the fixed member are electrically connected always to each other by the flat spring, and a hook portion prevent the movable member from being separated from the fixed member by an elastic restoring force applied to the movable member.

According to another aspect of the present invention, there is provided a circuit board on which a plurality of electronic components or electronic modules are mounted on a conductive pattern having various shapes to allow the electronic components or electronic modules to be electrically connected to the conductive pattern, the circuit board comprising: an elastic electric connecting terminal electrically connecting the conductive pattern to an external object, wherein the electric connecting terminal comprises: a cylindrical metallic fixed member mounted on the conductive pattern through reflow soldering using a solder cream; a cylindrical metallic movable member having a top surface on which an area for vacuum pickup is defined, the movable member being inserted into and slidably coupled to the fixed member; and a metallic spring accommodated into the fixed member, the spring having one end contacting with a bottom of the fixed member and the other end contacting with a bottom of the movable member so that the movable member is elastically slid with respect to the fixed member, wherein the movable member and the fixed member are electrically connected always to each other by the spring, and a hook portion prevent the movable member from being separated from the fixed member by an elastic restoring force applied to the movable member, and a soldered bottom surface of the fixed member is performed has an area greater than that of a top surface of the movable member.

According to another aspect of the present invention, there is provided a circuit board on which a plurality of electronic components or electronic modules are mounted on a conductive pattern having various shapes to allow the electronic components or electronic modules to be electrically connected to the conductive pattern, the circuit board comprising: an elastic electric connecting terminal electrically connecting the conductive pattern to an external object, wherein the electric connecting terminal comprises: a box-shaped metallic fixed member mounted on the conductive pattern through reflow soldering using a solder cream; a box-shaped metallic movable member having a top surface on which an area for vacuum pickup is defined, the movable member being inserted into and slidably coupled to the fixed member; and a metallic flat spring accommodated into the fixed member, the flat spring having one end contacting with a bottom of the fixed member and the other end contacting with a bottom of the movable member so that the movable member is elastically slid with respect to the fixed member, wherein the movable member and the fixed member are electrically connected always to each other by the flat spring, and a hook portion prevent the movable member from being separated from the fixed member by an elastic restoring force applied to the movable member.

BRIEF DESCRIPTION OF THE DRAWINGS

The above objects and other advantages of the present invention will become more apparent by describing in detail preferred embodiments thereof with reference to the attached drawings in which:

FIGS. 9A and 9B are views illustrating a surface-mount type electric connecting terminal according to another exemplary embodiment, of which FIG. 9A is a perspective view, and FIG. 9B is a cross sectional view taken along line B-B in FIG. 9A;

FIGS. 10A and 10B are views illustrating an electric connecting terminal according to another exemplary embodiment, of which FIG. 10A is a perspective view, and FIG. 10B is a cross sectional view taken along line C-C in FIG. 10A;

DETAILED DESCRIPTION OF THE INVENTION

Now, the surface-mount type electric connecting terminal according to the exemplary embodiments of the present invention will be described in detail with reference to the accompanying drawings.

Figure 1A:
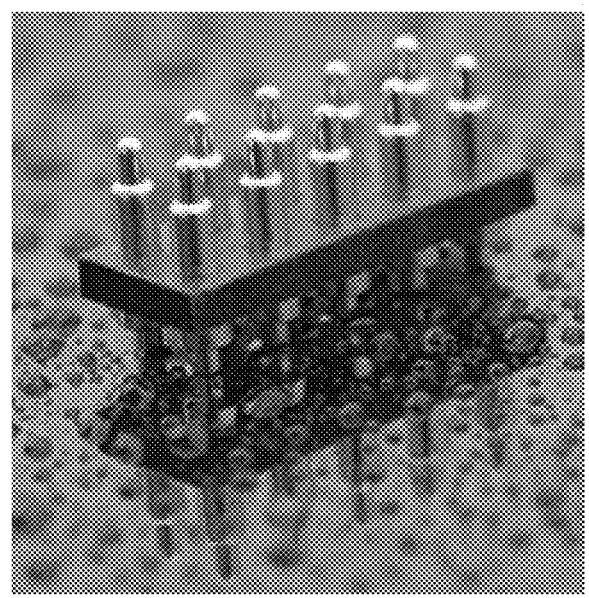
FIGS. 1A and 1B are product photos and cross-sectional views of a pogo pin of a related art.
Figure 1B:
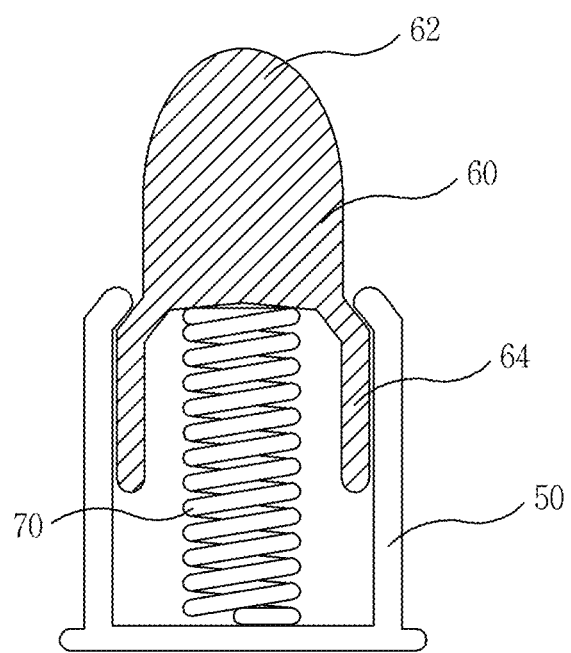
Figure 2:
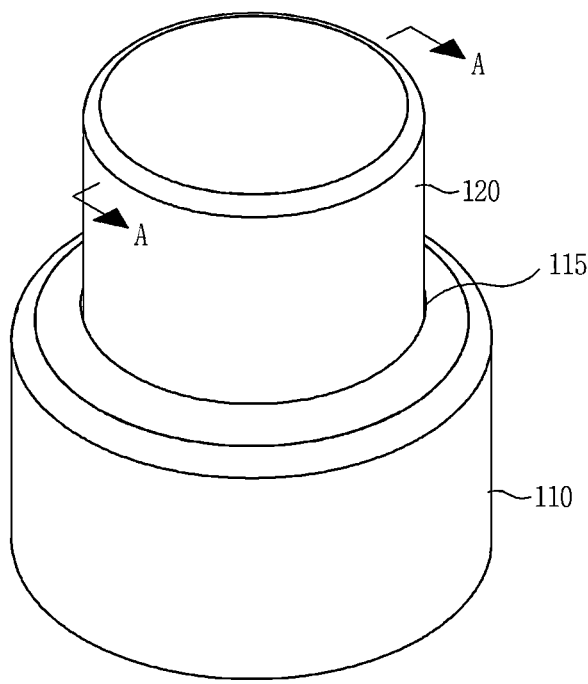
FIG. 2 is a perspective view illustrating a surface-mount type electric connecting terminal according to an exemplary embodiment of the present invention.
Figure 2A:
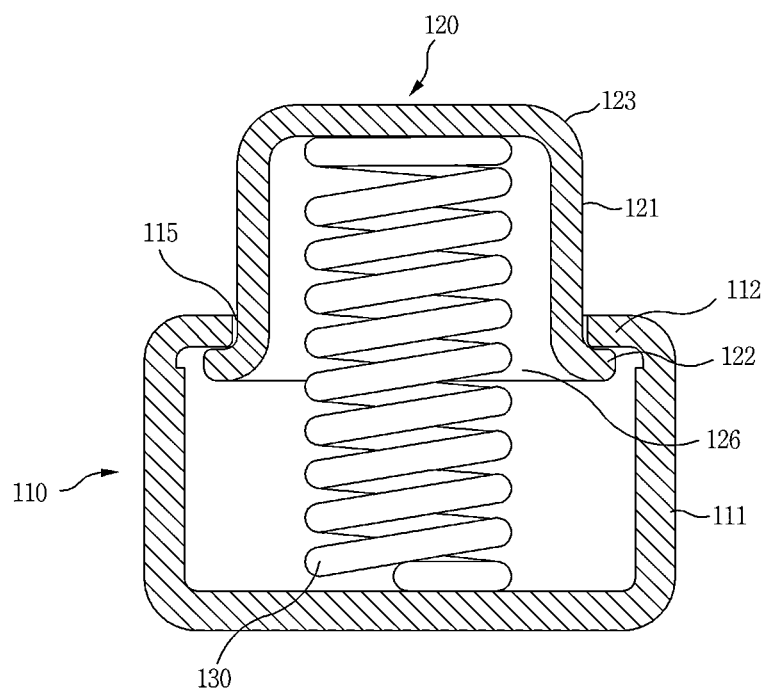
FIG. 2A is a cross-sectional view taken along line A-A in FIG. 2.
Figure 3A:
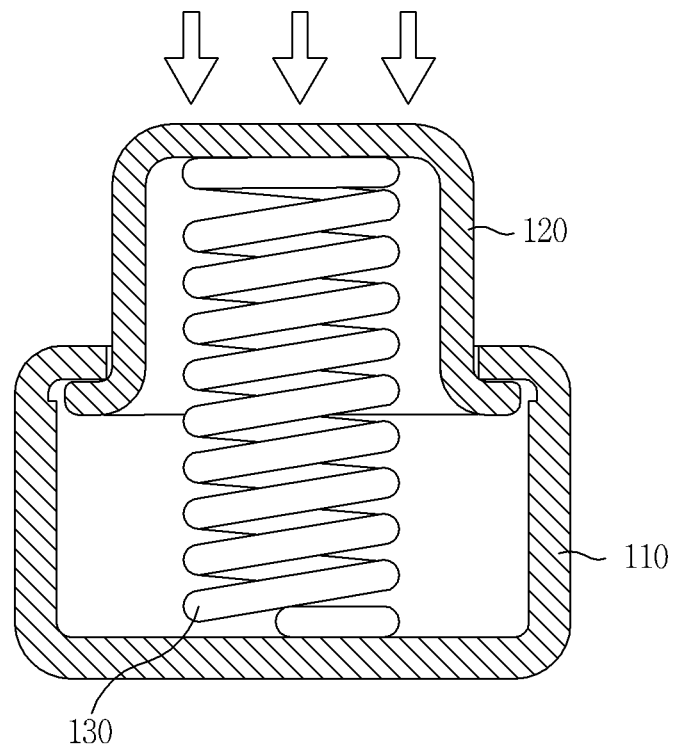
FIGS. 3A and 3B are views illustrating a state before and after a movable member is pressed.
Figure 3B:
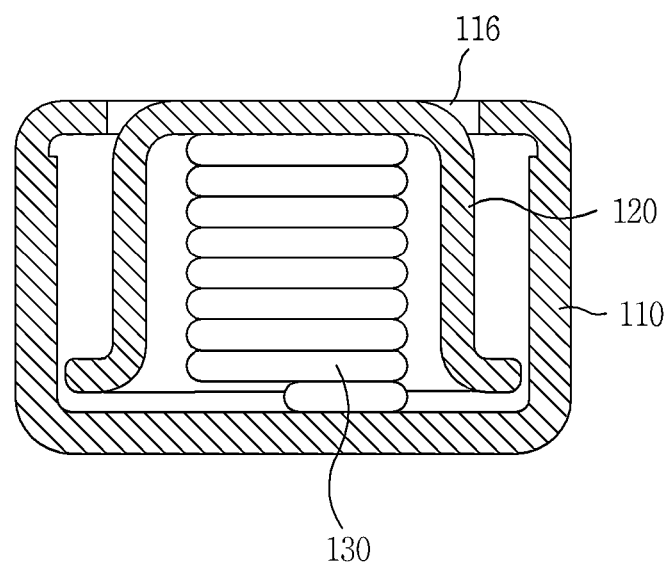
Figure 4A:
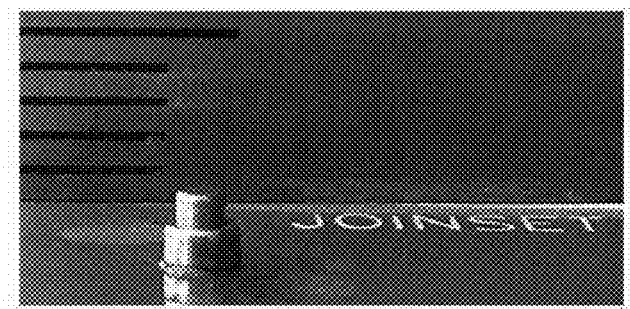
FIGS. 4A and 4B are photos illustrating actual products of a surface-mount type electric connecting terminal.
Figure 4B:
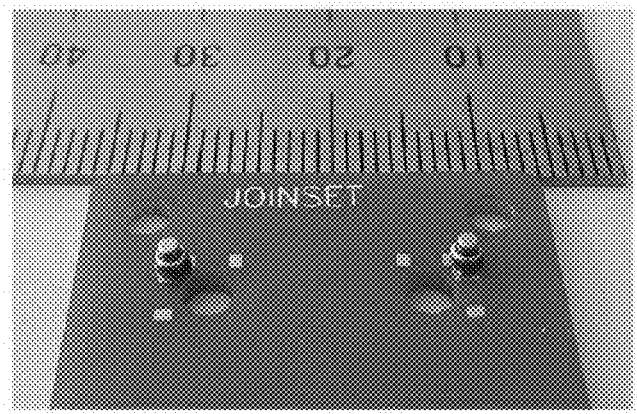

FIG. 2 is a perspective view illustrating a surface-mount type electric connecting terminal according to an exemplary embodiment of the present invention, FIG. 2A is a cross sectional view taken along line A-A in FIG. 2, FIGS. 3A and 3B are views illustrating a state before and after a movable member is pressed, and FIGS. 4A and 4B are photos illustrating actual products of a surface-mount type electric connecting terminal.

Referring to FIGS. 2 and 2A, a surface-mount type electric connecting terminal 100 includes a fixed member 110 which is made from a metallic material, a movable member 120 which may slide against the fixed member 110 and is made from a metallic material, and a spring 130 which provides elastic force and elastic recovery force by which the movable member 120 may be inserted in the fixed member 110 and may slide elastically against the fixed member 110.

Here, the movable member 120 is inserted in the fixed member 110 and slides against the fixed member 110 with a predetermined gap 115 between the movable member 120 and the fixed member 110. The movable member 120 has a larger diameter as compared with its height and the lower end surface of the fixed member 110 having the surface area larger than the surface area of the upper end surface of the movable member 120 is reliably soldered to a circuit board, so when the movable member 120 slides in the vertical direction, sway of the movable member 120 due to the gap 115 is decreased.

The electric connecting terminal 100 is disposed between the opposing conductive objects and electrically connects the opposing conductive objects with elasticity. The opposing conductive objects may be identified as a printed circuit board, an antenna, etc. In this case, the fixed member 110 may be fixed to a printed circuit board by soldering. As the antenna comes into contact with the movable member 120, the printed circuit board and the antenna may be electrically connected with elasticity.

The size of the electric connecting terminal 100 is not limited, but a small size electric connecting terminal 100 with a height of about 0.5 mm to 3 mm may be more efficiently used.

Referring to the photos illustrating the actual products in FIGS. 4A and 4B, the fixed member 110 and the movable member 120 have similar or same height in a state where the fixed member 110 and the movable member 120 are separated. For example, in the engaged state, the height of the fixed member 110 is about 1.2 mm, and the height of the protruded movable member 120 is about 0.8 mm, and the diameter of the fixed member 110 is about 2.0 mm, and the diameter of the movable member 120 may be about 1.3 mm which is smaller than the diameter of the fixed member 110, the sizes of which are just an example and may be changed if necessary.

The fixed member 110 and the movable member 120 may be formed in a cylindrical shape or an elliptical shape. If the fixed member 110 is formed in a cylindrical shape, the diameter of the cross section of the fixed member 110 may be about 3 mm or less.

The height of the electric connecting terminal 100 is same as or larger than the diameter of the fixed member 110, and the height of the electric connecting terminal 100 may be about 3 mm or less.

In such a manner, it is possible to increase the applicability of the electric connecting terminal 100 as compared with other related product by limiting the height of the electric connecting terminal 100 and the surface area where is soldered.

The electric resistances in the vertical direction of the electric connecting terminal 100 decrease when the movable member 120 is compressed, and they may be about 0.5 ohm or less under any typical conditions.

The height where the movable member 120 protrudes from the fixed member 110 may be identified as a operating distance (stroke), and the fixed member 110 may have a predetermined depth which is same as or larger than the protruding height of the movable member 120.

When the electric connecting terminal 100 is actually used, as illustrated in FIG. 4A, the height of the fixed member 110 may be same as or slightly larger than the height of the movable member 120 and may be formed in a cylindrical shape, but it is not limited thereto. The fixed member 110 may be a quadrangular shape whose corners are rounded.

An elastic rubber adhesive with a predetermined heat resisting property may be adhered and filled in the fixed member 110 and the movable member 120 and in the spring 130. In this case, since the spring 130 is fixed by an elastic rubber adhesive, workability may be enhanced. It is advantageous that the spring 130 is not well distorted, and the pressing force and the recovery force of the spring 130 may be controlled. Here, the elastic rubber adhesive may be a silicon rubber adhesive which has enhanced adhering force after curing.

Fixed Member 110

The fixed member 110 includes a singular body 110 made from a metallic material. For example, the fixed member 110 may be made from a copper alloy of which hardness is lower than that of the movable member 120. In this case, it is possible to prevent an outer surface of the movable member 120 from being scratched by friction.

The fixed member 110 is manufactured by a press process. More specifically, the fixed member 110 may be manufactured by a press process using a mold while drawing a metallic sheet with a thickness between about 0.05 mm to about 0.15 mm. The metallic sheet may be pressed and molded into a fixed member, so mass production is easy, workability is good, a manufacturing process is easy, yield may be enhanced, and manufacturing costs are low.

With regard to the exterior of the fixed member 110, the fixed member 110 includes a singular cylindrical body 111 whose one end defines an opening 115, and the other end is closed. In this exemplary embodiment, the opening 115 is circular, and the body 111 is cylindrical; however they may be formed in various shapes in combination with the body 111 and the opening 115. The corners of the other end of the fixed member are rounded.

The bottom of the fixed member 110 is fixed to a printed circuit board, etc. by soldering. An embossing 113 protrudes inward from the center of the bottom. The construction thereof will be described later.

A hook protrusion 112 is bent inward with a predetermined width and is formed along an edge of the opening 115 of the fixed member 110. A flange 122 of the movable member 120 contacts with and is caught by the hook protrusion 112 for thereby limiting the movement of the movable member 120.

The hook protrusion 112 may be formed by being bent using a press in a state where the movable member 120 is inserted in the fixed member 110.

Referring to FIG. 2A, the hook protrusion 112 is bent for its upper surface to be horizontal. Here, the hook protrusion 112 may be slanted downward or upward. In case that the hook protrusion 112 is slanted downward, when the movable member 120 is pressed to the fullest by the object, the upper surface of the movable member 120 may protrude more than an end of the hook protrusion 112.

The end surface of the hook protrusion 112, namely, the portion where contacts with the movable member 120 are smoothened through polishing, etc., whereby the outer surface of the movable member 120 may have less scratches when the movable member 120 reciprocates upward and downward through the opening 115 of the fixed member 110 as the electric connecting terminal 100 is repeatedly compressed.

As described earlier, the fixed member 110 and the movable member 120 may be manufactured by pressing a metallic sheet which has a uniform thickness. Shaking occurring during reflow soldering in the related art may be minimized in such a way that the thickness of the metallic sheet to be used when manufacturing the body 111 of the fixed member 110 is determined to be larger than the thickness of the metallic sheet of the body 121 of the movable member 120, so the center of gravity of the electric connecting terminal 100 may be positioned lower, more specifically, may be positioned in the fixed member 110.

Also, since the movable member 120 is inserted in the fixed member 110, the size of the horizontal cross section of the fixed member 110 is determined to be larger than the horizontal cross section of the movable member 120, whereby the weight of the fixed member 110 may be heavier than the weight of the movable member 120.

In this manner, the total weight of the fixed member 110 is determined to be heavier than the total weight of the movable member 120 in order for the center of gravity to be positioned in the fixed member 110, thus minimizing any shaking during reflow soldering.

The outermost layer of at least a lower surface of the fixed member 110 may be coated with a metal, namely, any of tin, silver and gold, which are reflow-soldered using a solder cream. The region of part of the lower surface may not be soldered so as to minimize the delaminating or leaning during soldering.

Movable Member 120

The movable member 120 includes a singular body 121 which is made from a metallic material. The movable member 120 may be made from a predetermined material, namely, a copper alloy, a stainless steel or a steel alloy which has the same hardness as the fixed member 110, but not limited thereto.

In case that the material of the movable member 120 has a hardness higher than that of the material of the fixed member 110, when friction occur against the fixed member 110 as the movable member 120 slides upward and downward, abrasions or scratches may occur on the fixed member 110 which has lower hardness, thus minimizing any damages to the outer surface of the movable member 120.

The hardness of the materials themselves of the movable member 120 and the fixed member 110 may be determined to be different in order for the hardness of the movable member 120 to be same as or higher than the hardness of the fixed member 110. In this regard, only the hardness of the outermost layers of the movable member 120 and the fixed member 100 may be determined to be different. For example, chrome, etc. may be coated so as to enhance the hardness of the outermost layer of the movable member 120. In this case, it is disadvantageous that the electric resistance increases.

The movable member 120 is manufactured by a pressing process. More specifically, the movable member 120 may be manufactured by a press process using a mold while drawing a metallic sheet. The metallic sheet is manufactured by a press process, so it is advantageous that workability is good, a manufacturing process is easy, yield may be enhanced, and manufacturing costs are low.

Like the fixed member 110, the movable member 120 includes a singular, cylindrical body 121 whose one end defines an opening 126, and the other end is closed. In this exemplary embodiment, the movable member 120 is formed in a cylindrical shape, but not limited thereto. The corners of the other end of the movable member 120 are rounded.

The flange 122 may extend horizontally, if possible, in order not to affect the moving distance (stroke) of the movable member 120. As long as the hook protrusion 112 is shaped to match with the shape of the flange 122, it is also not limited thereto.

The width of the flange 122 is not limited, and it will be enough if it is sized to the extent that the flange is not disengaged by the elastic recovery force of the spring 130 after it is caught by the hook protrusion 112 of the fixed member 110. The distance between an end surface of the flange 112 and the inner surface of the fixed member 110 is as larger as possible. Even if the movable member 120 is slanted while the object pressurizes the movable member 120, the flange 122 needs not to contact with the inner surface of the fixed member 110, thereby obtaining a smooth sliding of the movable member 120.

Since the flange 122 has a predetermined height corresponding to the thickness of the movable member 120, the moving distance of the movable member 120 will be not largely decreased by the flange 122 because the thickness is thin. In other words, in case of the pogo pin of the related art, since the length of the guide portion of the movable member is long, the height should be increased so as to obtain a predetermined moving distance in up and down directions. In the present invention, since the flange 122 corresponding to the guide portion has a predetermined height as high as the thickness of the movable member 120, the entire height of the electric connecting terminal 100 may be lowered while obtaining a predetermined moving distance.

The upper surface of the movable member 120 is flat in a horizontal direction for the sake of vacuum pickup. Since the upper surface of the movable member 120 is flat in a horizontal direction, the bottom of the movable member 120 may be also flat in a horizontal direction, so the contact area with the spring 130 may increase, so the electric resistance or contact resistance may be reduced in up and down directions.

Here, the degree of the flatness of the upper surface means a degree where the vacuum pickup is possible. During the actual manufacturing process, it may be a little grooved in a downward direction or it may be bulged in an upward direction.

The outermost layer of the movable member 120 may be coated with gold so as to enhance anticorrosion property and electrical conductivity.

Spring 130

The spring 130 is made from an elastic metallic material with good electrical conductivity and is housed in the fixed member 110. One end of the spring 130 contacts with the bottom of the fixed member 110, and the other end contacts with the bottom of the movable member 120 for thereby providing elastic force and elastic recovery force to the movable member 120 which is movable in up and down directions.

The spring 130 is manufactured in such a way to wind multiple times a metallic wire with electrical conductivity, with each turn being spaced apart to have elasticity in a vertical direction.

The spring 130 is configured to perform important functions with the exception that it supplies electric force to the electric connecting terminal 100 itself as the movable member 120 elastically moves in up and down directions.

As mentioned above, the movable member 120 may smoothly move in up and down directions unless the movable member 120 contacts with the inner surface of the fixed member 110. As a result, in case that the movable member 120 is pressed by the object, a predetermined gap is formed between the movable member 120 and the fixed member 110, so the movable member 120 and the fixed member 110 may not be electrically connected. In this case, it is possible to keep the movable member 120 and the fixed member 110 electrically connected all the time by making the spring 130 with an electrically conductive material. In other words, the spring 130 may become a main electric passage between the movable member 120 and the fixed member 110.

The spring 130 may be a coil spring on which any of piano wire, stainless steel wire, copper alloy wire, etc. having high hardness and good elasticity and a diameter of about 0.05 mm to about 0.2 mm may be spirally wound. The pressing force may be about 30 gf to about 500 gf, but not limited thereto.

The spring 130 may be coated with gold to have good electrical conductivity.

The wound spring 130 is not limited to a circular shape, and it may be formed in another shape.

In case of the coil spring, the elastic recovery force of the spring 130 may be determined in combination with the diameter and pitch of the wire belonging to the coil spring and the length (free length) when the spring is not compressed.

The embossing which protrudes from the center of the bottom of the fixed member 110 is inserted to an end of the spring 130, so it is possible to prevent the end of the spring 130 from slipping on the bottom of the fixed member 110 by the pressing of the movable member 120.

FIGS. 3A and 3B are views illustrating states before and after each movable member is pressed.

The electric connecting terminal 100 may be supplied in a state where it is reel-taped on a carrier or it is aligned on a palate. The electric connecting terminal 100 is arranged on a conductive pattern of a printed circuit board by vacuum picking up the upper surface of the movable member 120 and is surface-mounted by reflow soldering using solder cream.

As illustrated in FIG. 3A, an electrically conductive object such as an antenna, etc. presses and comes into contact with the upper surface of the surface-mounted electric connecting terminal 100. At this time, the movable member 120 moves downward by pressing force from the object. The movable member 120 moves receiving elastic force of the spring 130.

As the movable member 120 moves downward, the spring 130 is elastically transformed and is contracted in the heightward direction.

In case that the movable member 120 moves upward by elastic recovery force of the spring 130 when the pressing force on the movable member 120 is removed, the flange 122 of the movable member 120 is surely caught by the hook protrusion 112 of the fixed member 110 for thereby surely preventing the disengaging of the movable member 120 by elastic recovery force of the spring 130 even in the middle of reflow soldering or even if there is plenty of movement in the objects.

Figure 5:
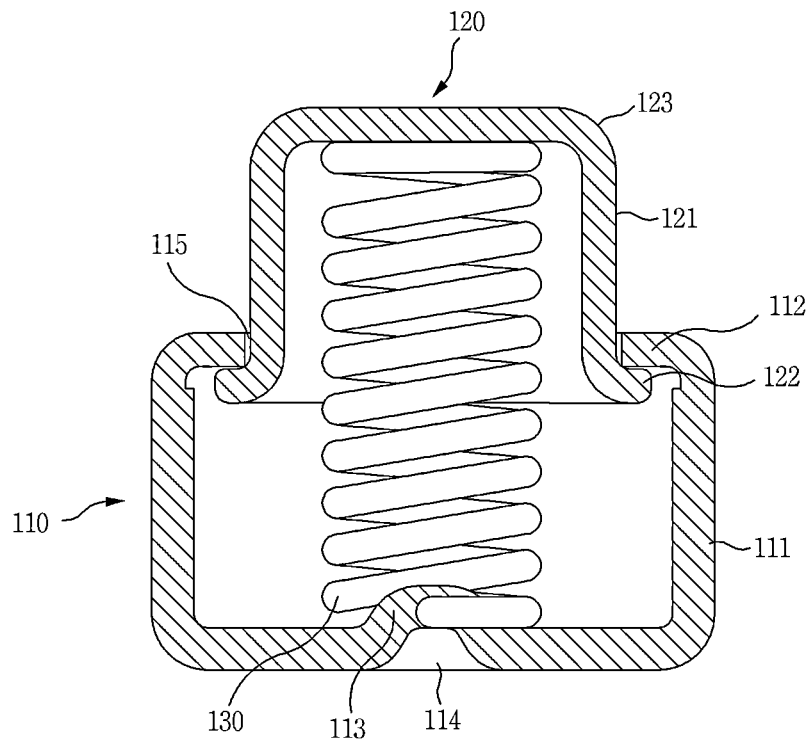
FIG. 5 is a perspective view illustrating a surface-mount type electric connecting terminal according to another exemplary embodiment of the present invention.

FIG. 5 is a perspective view illustrating a surface-mount type electric connecting terminal according to another exemplary embodiment of the present invention.

In this exemplary embodiment, the embossing 113 may protrude from the center of the bottom of the fixed member 110. As a result, a groove 114 may be formed in a lower surface of the body 111.

In this exemplary embodiment, the embossing 113 and the groove 114 have important functions.

In the mass production line, since it is very hard to make the lower surface of the fixed member 110 accurately flat in a horizontal direction, the soldering may be accurately conducted by forming the groove 114 at the center of the lower surface even when the lower surface of the fixed member 110 is not flat enough in a horizontal direction.

During the soldering, it is possible to prevent the fixed member 110 from leaning, delaminating or distorting, which occurs when the solder cream coated on the conductive pattern of the printed circuit board is not uniform, by the molten solder cream.

Figure 5A:
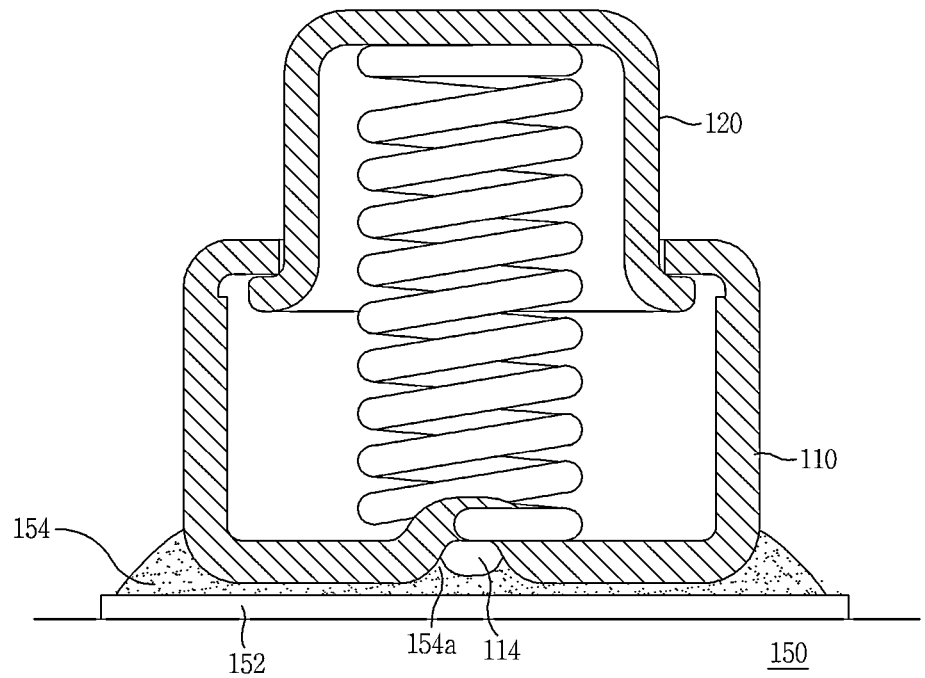
FIG. 5A is a view illustrating a state in which an electric connecting terminal is mounted during reflow soldering on a solder cream formed on a conductive pattern of a printed circuit board.

FIG. 5A is a view illustrating a state in which an electric connecting terminal is mounted during reflow soldering on a solder cream formed on a conductive pattern of a printed circuit board.

If the solder cream coated on the conductive pattern 12 of the printed circuit board 10 is not coated with uniform thickness or if the electric connecting terminal 100 is not positioned at the center or if the lower surface of the fixed member 110 is not accurately flat in a horizontal direction, there may be a difference in an amount of solder creams positioned at the left and right sides during the soldering when viewing from the vertical cross section, the fixed member 110 may be slanted, delaminated or distorted by molten solder cream.

Referring to FIG. 5A, the self-weight of the electric connecting terminal 100 placed on the molten solder cream 14 during the soldering presses the solder cream 14, and as a result even if a difference occurs in the amounts of the solder creams 14 positioned at left and right sides of the lower surface of the fixed member 110, the solder cream 14 is inputted in the groove 114 by the amount of the solder cream remaining due to the difference, so the solder cream 14 on the lower surface of the fixed member 110 has relatively uniform thickness for thereby preventing the delaminating, slanting and leaning of the electric connecting terminal 100.

At the same time, the soldered surface area increases due to the solder layer formed by the solder cream 14a inputted in the groove 114 for thereby enhancing the soldering strength.

The embossing 113 illustrated in FIG. 5 is inserted in an end of the spring 130 housed in the fixed member 110 and supports the spring 130, so any distortion of the spring may be prevented when the movable member 120 moves by the object.

Figure 6:
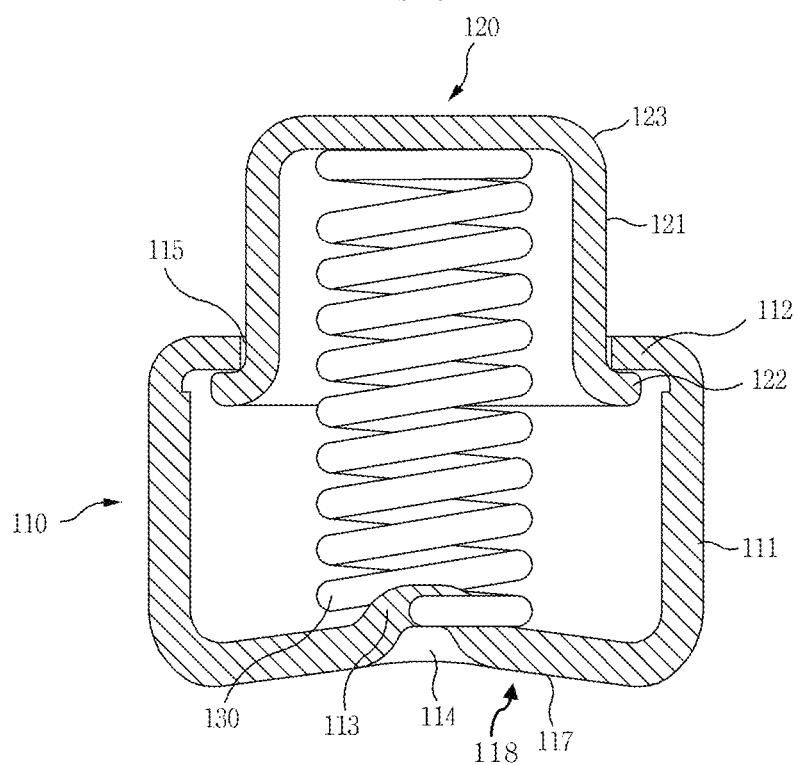
FIG. 6 is a perspective view illustrating a surface-mount type electric connecting terminal according to another exemplary embodiment of the present invention.

FIG. 6 is a perspective view illustrating a surface-mount type electric connecting terminal according to another exemplary embodiment of the present invention.

In this exemplary embodiment, the lower surface of the fixed member 110 may have a recess 118 of cone shape defined as a slanted surface 117 which is slanted downward from the edge to the center.

As described earlier, in the mass production process, it is very hard to make the lower surface of the fixed member 110 accurately flat in a horizontal direction. Due to the recess 118 of the lower surface of the fixed member 110, even when the molten solder cream boils during soldering and moves the fixed member 110, the recess 118 of the lower surface of the fixed member 110 absorbs the movement of the solder cream for thereby preventing the fixed member 110 from being slanted, whereby the delaminating or leaning phenomenon may be prevented, which results in enhanced soldering.

The surface area of the lower surface of the fixed member 110 may increase by the recess 118, thus enhancing the soldering strength.

Referring to FIG. 6, in a structure where the lower surface of the fixed member 110 has the recess 118 defined as a slanted surface 117 which is slanted from the edge to the center, a groove 114 in FIG. 5 may be formed at the center of the recess 118. Since the thickness and the size of the fixed member 110 is thin and small respectively, when the lower surface of the fixed member 110 is drawn in while the embossing 113 is being formed, the slanted surface 117 may be naturally formed, so the recess 118 may be provided.

According to the above described structure, it is possible to obtain wider soldering surface area, thus enhancing the soldering strength. More surplus solder cream may be accommodated, and it is possible to keep the solder cream with uniform thickness on the lower surface of the fixed member 110 for thereby preventing the delaminating and leaning during soldering.

Figure 7:
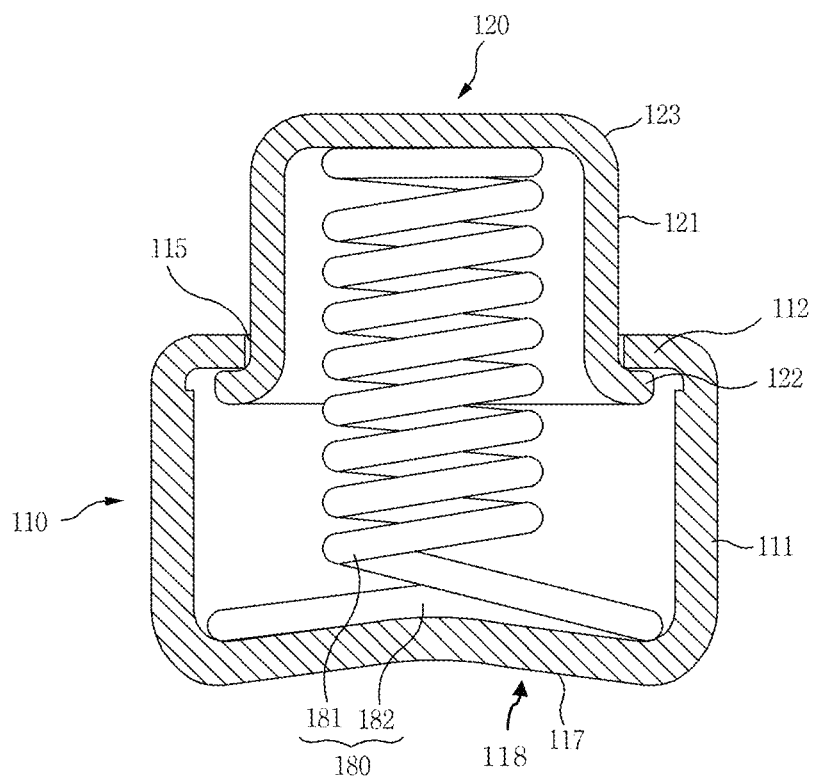
FIG. 7 is a perspective view a surface-mount type electric connecting terminal according to another exemplary embodiment of the present invention.

FIG. 7 is a perspective view illustrating a surface-mount type electric connecting terminal according to another exemplary embodiment of the present invention.

In this exemplary embodiment, the spring 180 includes a small diameter portion 181 and a large diameter portion 182. The small diameter portion 181 contacts with the bottom of the movable member 120, and the large diameter portion 182 contacts with the bottom of the fixed member 110.

The large diameter portion 182 may include at least one turn which contacts with the bottom of the fixed member 110 for thereby not limiting the movement of the movable member 120.

According to the above construction, the large diameter portion 182 of the spring 180 is arranged along the edge of the bottom of the fixed member 110 for thereby being supported by the inner surface of the fixed member 110, so without the presence of the embossing 113, it is possible to prevent the end of the spring 180 from slipping on the bottom of the fixed member 110 which used to occur due to the pressing of the movable member 120.

FIG. 7 is a view illustrating a state where the spring 180 is adapted to the structure in which the lower surface of the fixed member 110 is recessed toward the center. The spring 180 including the small diameter portion 181 and the large diameter portion 182 may be applied to a structure in which the lower surface of the fixed member 110 is flat.

Figure 8A:
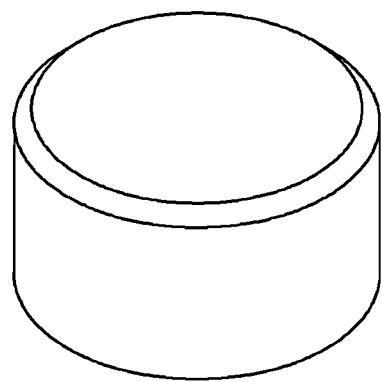
FIGS. 8A and 8B are views illustrating states where a lower surface of a fixed member of an electric connecting terminal is divided into a portion where is soldered and a portion where is not soldered.
Figure 8B:
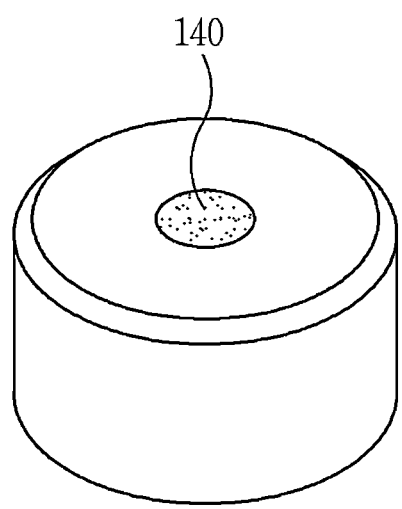

FIGS. 8A and 8B are views illustrating a state where the lower surface of the fixed member 110 of the electric connecting terminal 100 according to another exemplary embodiment is divided into a portion where is soldered and a portion where is not soldered.

The outermost layer of the lower surface of the fixed member 110 may be coated with a metal, for example, any of silver or gold which may be reflow-soldered using solder cream for thereby forming a soldering region where may be easily soldered.

FIG. 8A is a view illustrating a state where the whole lower surfaces of the fixed member 110 is a soldering region. On the conductive pattern 12 of the printed circuit board 10, the solder cream 14 may be coated in the same pattern as the soldering region of the lower surface or may be coated in a donut shape wherein a predetermined region of the center is emptied.

In case that the center of the solder pattern of the solder cream coated on the portion corresponding to the lower surface of the fixed member 110 is not coated with solder cream like the donut shape, the empty portion of the center serves to receive the boiling and molten solder cream during the reflow soldering using solder cream for thereby preventing the fixed member 110 from being delaminated or leant during soldering, whereby it is possible to enhance the reliability of soldering.

FIG. 8B is a view illustrating a state where a non-soldering region 140 is formed at the center of the lower surface of the fixed member 110.

Here, the non-soldering region represents a region where is not soldered using typical solder cream.

The non-soldering region 140 may be formed by coating heat-resisting polymer. Here, the heat-resisting polymer may be any of epoxy resin, polyimide and silicon rubber resin which have adhering force.

The non-soldering region 140 formed at the center of the lower surface of the fixed member 110 serves to receive boiling and molten solder cream, so it is possible to prevent the fixed member 110 from being delaminated or leant during soldering, thus enhancing reliability of soldering.

Referring to FIG. 8B, in case that a non-soldering region 140 is formed in a circular shape at the center of the lower surface of the fixed member 110, it is easy to surface-mount the electric connecting terminal 100 because the non-soldering region 140 does not have any orientation in left and right or upward and downward directions.

FIGS. 8A and 8B are views illustrating a state where a non-soldering region 140 is formed in a structure wherein the lower surface of the fixed member 110 is flat, but not limited thereto. Such a construction may be adapted to a recessed structure wherein a groove 114 is formed in the lower surface of the fixed member 110.

Meanwhile, the amount of the solder cream 14 coated on the conductive pattern 12 of the printed circuit board 10 may be reduced by forming the non-soldering region 140, thus reducing manufacturing cost.

Figure 9A:
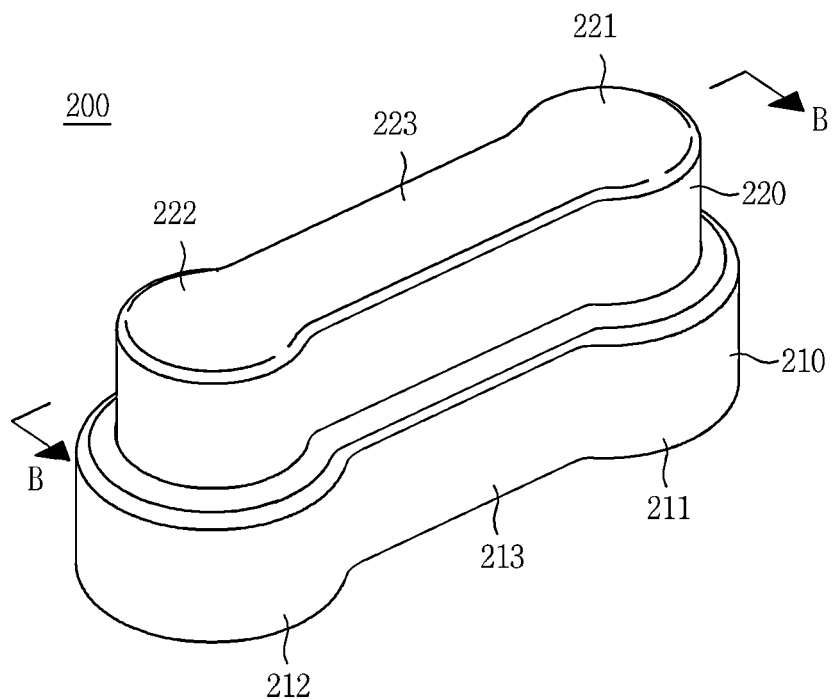
Figure 9B:
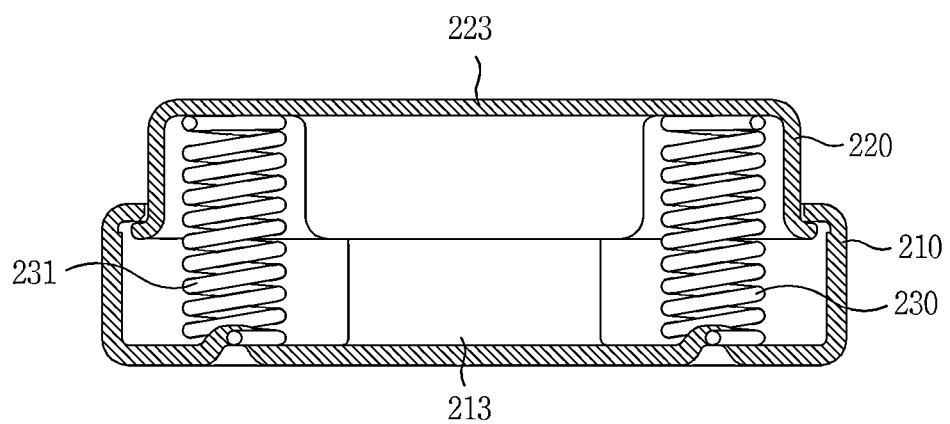

FIGS. 9A and 9B are views illustrating a surface-mount type electric connecting terminal according to another exemplary embodiment, of which FIG. 9A is a perspective view, and FIG. 9B is a cross sectional view taken along line B-B in FIG. 9A.

The fixed member 210 and the movable member 220 of the electric connecting terminal 200 include pairs of wide width portions 211, 212 and 221, 222 disposed at both sides, and narrow width portions 213 and 223 which are disposed between the pairs of the wide width portions 211, 212 and 221, 222 and connect them, which are shaped like a dumbbell or a peanut when viewing them from the above.

Referring to FIG. 9B, the springs 230 and 231 are housed in the pairs of the wide width portions 211, 212 and 221, 222 for thereby symmetrically supplying elastic force to the movable member 220 from both sides thereof.

The springs 230 and 231 housed in the pairs of the wide width portions 211, 212 and 221, 222 are smaller than the diameters of the wide width portions 211, 212 and 221, 222, but larger than the diameters of the narrow width portions 213 and 223, so the springs 230 and 231 may not enter into the narrow width portions 213 and 223 after they disengage from the wide width portions 211, 212 and 221, 222.

The electric connecting terminal 200 operates based on the same technology principle as an exemplary embodiment and has narrow width and long length corresponding to the line width of the circuit. Therefore, even when the electric connecting terminal 200 has the same contact surface area as compared with an exemplary embodiment, it may have a predetermined shape which corresponds to the conductive pattern of the printed circuit board, so it is more efficient.

Figure 10A:
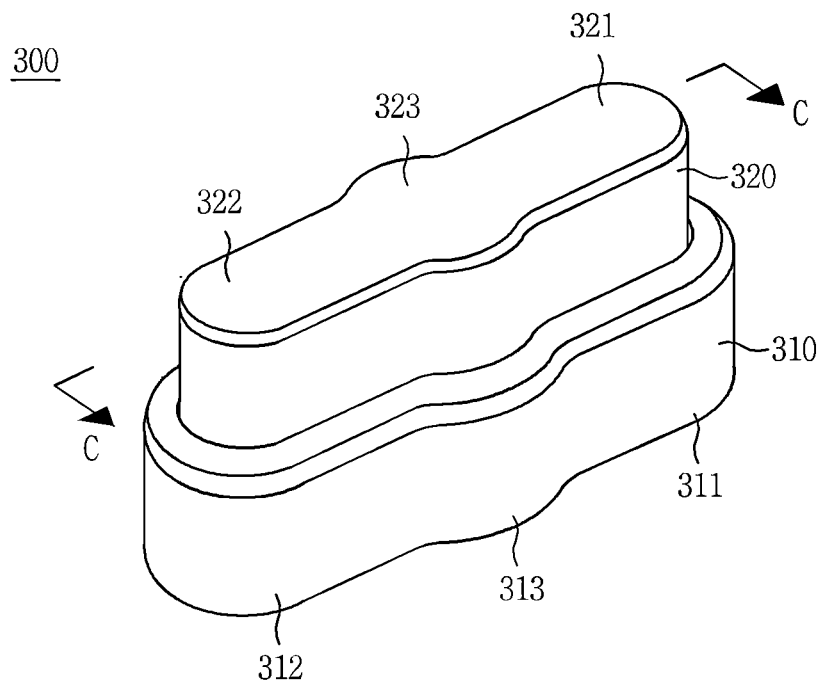
Figure 10B:
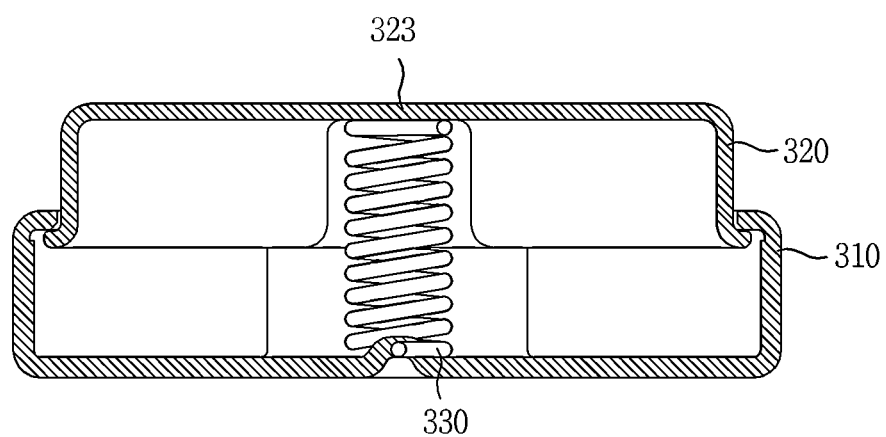

FIGS. 10A and 10B are views illustrating an electric connecting terminal according to another exemplary embodiment, of which FIG. 10A is a perspective view, and FIG. 10B is a cross sectional view taken along line C-C in FIG. 10A.

The electric connecting terminal 300 of this exemplary embodiment has a structure which is similar with the exemplary embodiment in FIG. 9A. The fixed member 310 and the movable member 320 include wide width portions 313 and 323 formed at the center, and pairs of narrow width portions 311, 312 and 321, 322 disposed at both sides thereof.

Referring to FIG. 10B, one spring 330 is housed in the wide width portions 313 and 323 for thereby supplying elastic force to the movable member 320 from the center.

Also in this exemplary embodiment, the spring 330 housed in the wide width portions 313 and 323 is smaller than each of the diameters of the wide width portions 313 and 323, but larger than each of the diameters of the narrow width portions 311, 312 and 321, 322, so the spring 330 may not enter into the narrow width portions 311, 312 and 321, 322 after they disengage from the wide width portion 313.

In the exemplary embodiments in FIGS. 9 and 10, the same widths may be determined without considering the wide width portion and the narrow width portion. In this case, it needs to form embossing which supports the end of the spring at where the spring is positioned.

Figure 11:
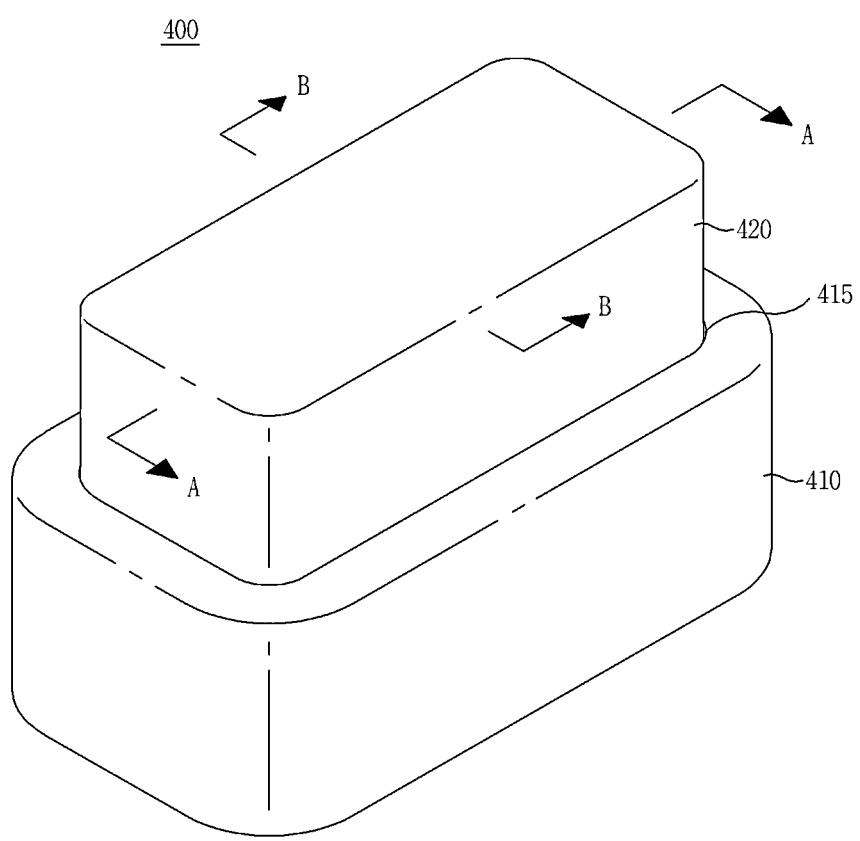
FIG. 11 is a perspective view illustrating a surface-mount type electric connecting terminal according to another embodiment of the present invention.
Figure 12:
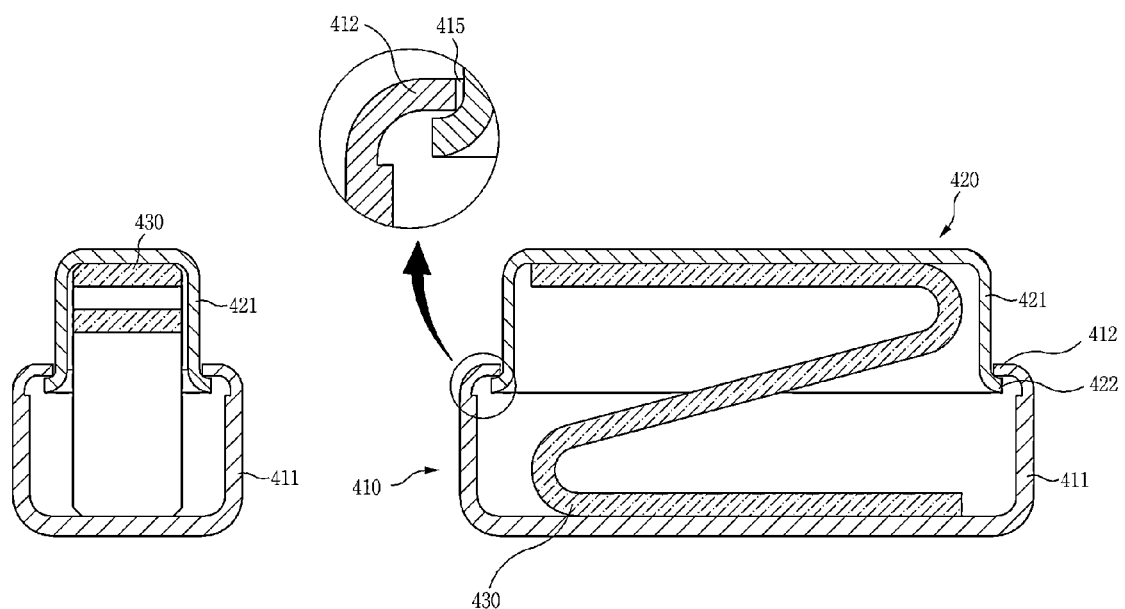
FIG. 12 is a cross-sectional view taken along line A-A and line B-B in FIG. 11.
Figure 13A:
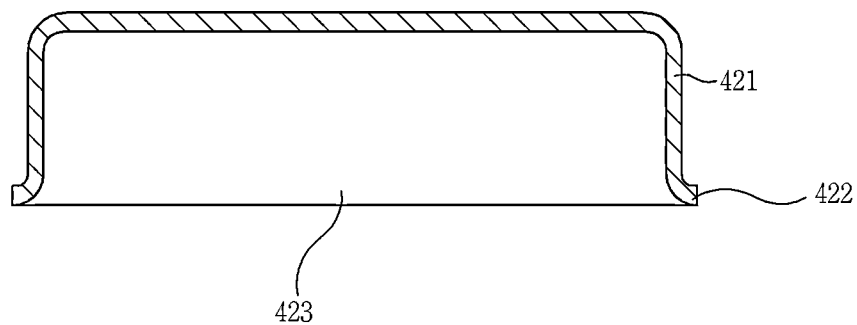
FIGS. 13A and 13B are views illustrating a movable member and a fixed member, respectively.
Figure 13B:
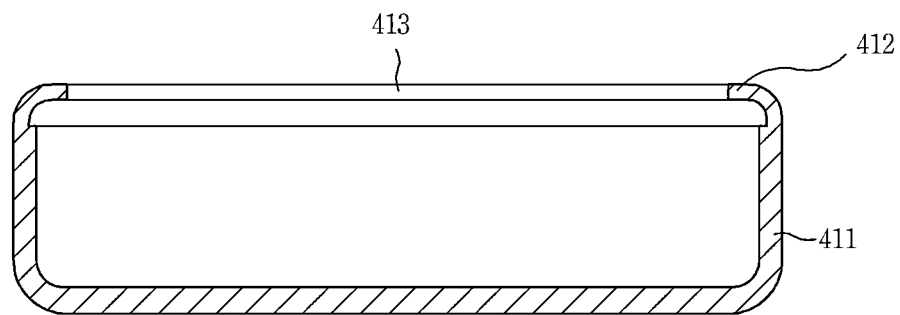

FIG. 11 is a perspective view illustrating a surface-mount type electric connecting terminal according to another embodiment of the present invention, and FIG. 12 is a cross sectional view taken along line A-A and line B-B in FIG. 11, and FIGS. 13A and 13B are views illustrating a movable member and a fixed member, respectively.

Referring to FIG. 11, the electric connecting terminal 400 comprises a fixed member 410 which is made from a metallic material, a movable member 420 which is engaged slidably against the fixed member 410 and is made from a metallic material, and a flat spring 430 which provides elastic force and elastic recovery force, so the movable member 420 may slide elastically against the fixed member 410.

Here, the flat spring 430 may be identified as a flat shaped spring with a uniform thickness. The electrical conductive flat spring may be manufactured by bending and pressing a metallic sheet with high elasticity.

In this exemplary embodiment, the electric connecting terminal 400 is formed in a rectangular shape in an engaged state because the fixed member 410 and the movable member 420 are formed in a rectangular shape, but not limited thereto.

The size of the electric connecting terminal 400 is not limited, but a small size electric connecting terminal 400 with a height of below 3 mm may be more efficiently used. For example, the fixed member 410 and the movable member 420 may have similar or same heights in a state where they are separated. In the engaged state, the height of the fixed member 410 is about 2.0 mm, and the height of the protruding movable member 420 is about 0.9 mm. In addition, the width and length of the fixed member 410 are about 1.0 mm and 3.0 mm, and the width and length of the movable member 420 are about 0.8 mm and 2.7 mm, but such sizes are suggested just as an example and may be properly changed if necessary.

When the electric connecting terminal 400 is actually used, since the height of the fixed member 410 is similar with and same as the height of the electric connecting terminal 400, the electric connecting terminal 400 is lower and flat in whole as compared with the soldering surface area, but not limited thereto.

As illustrated in FIG. 13B, the fixed member 410 includes a rectangular, singular body 411 in an upper surface of which an opening 413 is formed. Each corner may be rounded. It doesn't have to necessarily be rounded, but manufacturing may be hard if a bending is performed without being rounded.

A predetermined portion of the edge of the opening 413 of the fixed member 410 is bent inwardly for thereby forming a hook protrusion 412. The flange 422 contacts with the movable member 420 for thereby preventing the movable member 420 from being disengaged.

Figure 14A:
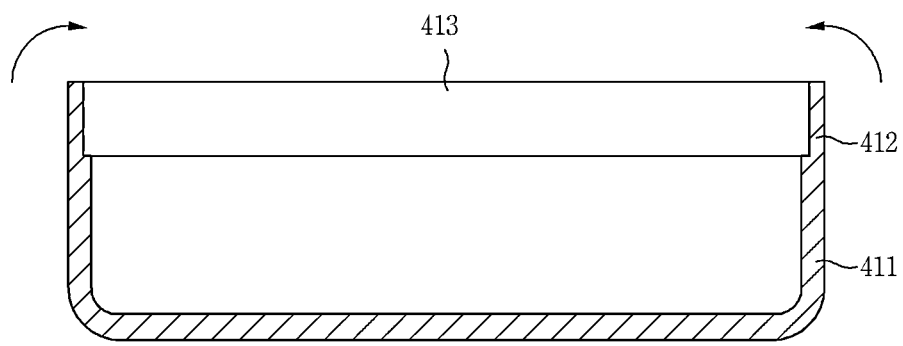
FIGS. 14A and 14B are views illustrating a state before and after a fixed member is processed; wow
Figure 14B:
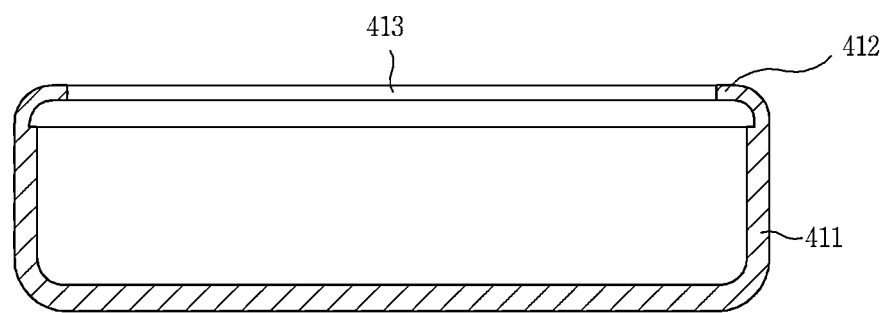

FIGS. 14A and 14B are views illustrating a state before and after a fixed member is processed.

A thin lip may be formed along an inner edge of the opening 413, for example, by pressing a corresponding portion of the body 411. As the lip is formed, as illustrated in FIG. 14A, when the edge of the opening 413 of the fixed member 410 is inwardly bent, it may be easily bent at a position where the lip begins for thereby forming a hook protrusion 412.

When a polymer filler, for example, silicon rubber with heat-resisting property, which provides elastic force together with the flat spring 430, is filled in the fixed member 410, it is advantageous to adjust pressing force and elastic recovery force.

The movable member 420 includes a rectangular box-shaped singular body 421 in a lower surface of which an opening 423 is formed. Each corner has a predetermined curvature.

A flange 422 extends outward in a horizontal direction along an edge of the opening 423 of the movable member 420. The flange 422 is hooked by the hook protrusion 412 of the fixed member 410 to stop the movement of the movable member 420.

Since the movable member 420 is inserted in the fixed member 410, the diameter of the body 421 of the movable member 420 is smaller than the diameter of the body 411 of the fixed member 410. Particularly, since the flange 422 protrudes, the body 421 of the movable member 420 becomes smaller.

The upper surface of the movable member 420 is at least flat for the sake of vacuum pickup and comes into direct contact with the object. If a predetermined space for the vacuum pickup of the electric connecting terminal 400 is obtained, a contact protrusion may be formed on the upper surface of the movable member 420, so electric contact with the object may become more reliable.

Figure 15:
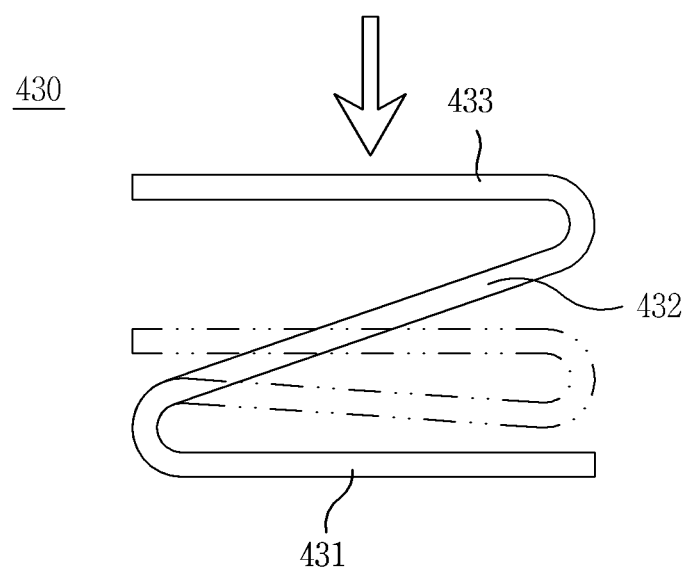
FIG. 15 is a view illustrating a modified shape of a flat spring.

FIG. 15 is a view illustrating a modified shape of the flat spring.

The flat spring 430 has electrical conductivity and includes contact portions 431 and 433 contacting with the bottom of each of the fixed member 410 and the movable member 420, and an elastic transformation portion 432 which connects the contact portions 431 and 433 and is elastically transformed by external pressure.

The boundary between the contact portions 431 and 433 and the elastic transformation portion 432 may be bent with a predetermined curvature radius or may have a constant included angle The widths of the contact portions 431 and 433 and the elastic transformation portion 432 may be same or the width of the elastic transformation portion 432 may be determined to be smaller than the width of each of the contact portion 431 and 433.

The widths and lengths of the contact portions 431 and 433 are determined to be same or shorter than the width and length of the bottoms of each of the fixed member 410 and the movable member 420, thus maximizing the contact surface area, but minimizing contact resistance.

The electric resistance of the flat spring 430 may be decreased in such a way to coat the flat spring 430 with gold.

The flat spring 430 may have an important meaning for the following reasons.

The flat spring 430 contracts by the pressure which is transferred to the movable member 420. It is possible to get uniform pressure which is transferred to the movable member 420 by the contact portion 433 of the flat spring 430 which has wider surface area as compared with the coil spring. As a result, when the movable member 420 receives a pressure by the object, the movable member 420 may move in up and down direction, not slanting.

The electric resistance of the flat spring 430 having predetermined thickness and surface area electrically and mechanically connecting the fixed member 410 and the movable member 420 is smaller than the electric resistance of the coil spring on which thin metallic wire is wound, so it is possible to connect the fixed member 410 and the movable member 420 with small electric resistance.

In this exemplary embodiment, the flat spring 430 has a Z-shaped cross section, but not limited thereto.

Figure 17A:
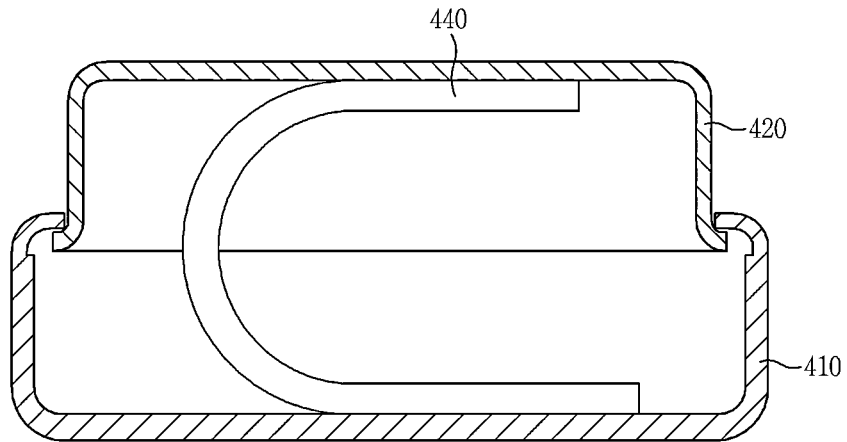
FIGS. 17A to 17C are illustrating the surface-mount type electric connecting terminals to which different flat springs are adapted.
Figure 17B:
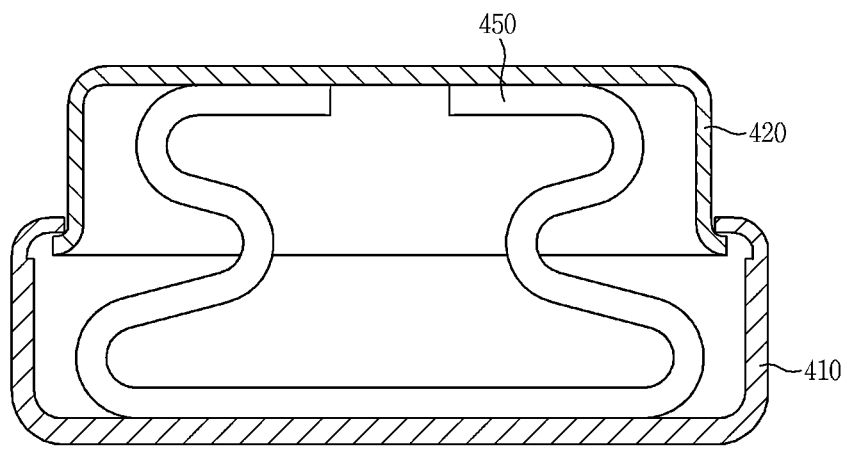
Figure 17C:
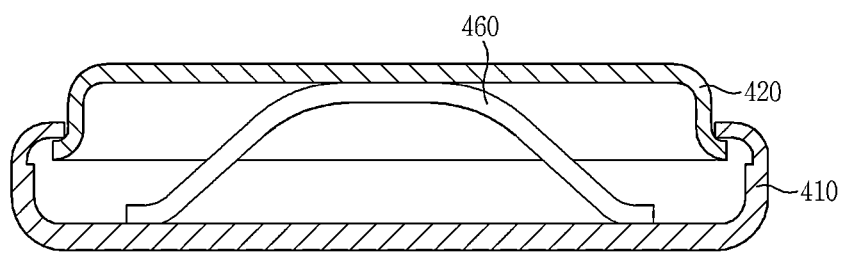

FIGS. 17A to 17C are views illustrating a surface-mount type electric connecting terminal to which different flat springs are adapted.

Referring to FIG. 17A, the electrical conductive flat spring 440 is formed in a C-shape, and referring to FIG. 17B, the electrical conductive flat spring 450 is formed in a pair of opposing i-shapes. The electrical conductive flat spring 440 includes a pair of contact portions and at least one elastic transformation portions.

Referring to FIG. 17C which illustrates a little peculiar shape, the electrical conductive flat spring 460 may be adapted in case that the fixed member 410 and the movable member 420 have long lengths, narrow widths and low heights. The electrical conductive flat spring 460 has a strip shape whose center portion is bent upward.

The flat spring 430 may be made from stainless steel or steel alloy which has high hardness and good elasticity. The outermost layer may be coated with gold so as to enhance corrosion prevention and electrical conductivity.

The elastic force (or elastic recovery force) of the flat spring 430 may be determined in combination with the thickness and width of the flat spring 430 and a curvature at the boundary between the contact portions 131, 133 and the elastic transformation portion 132.

Figure 16A:
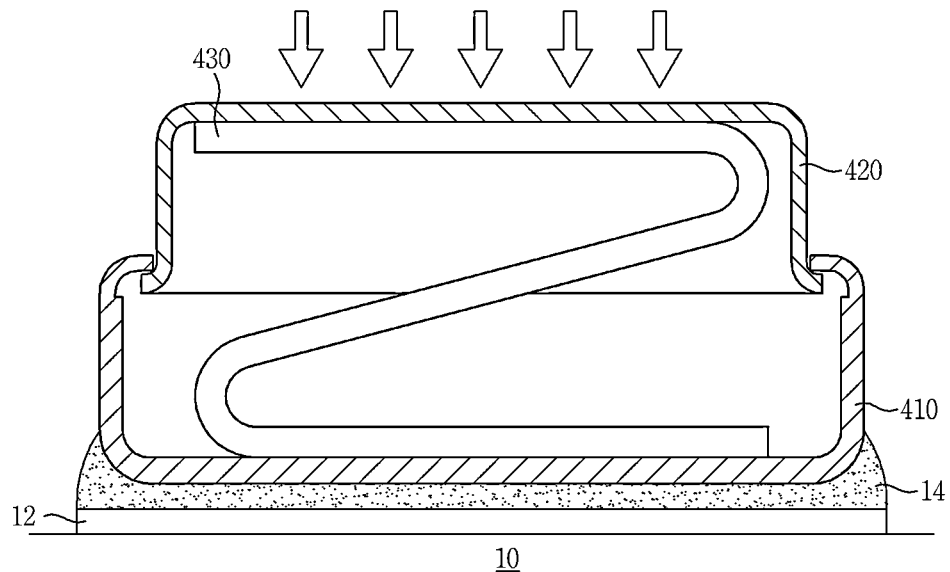
FIGS. 16A and 16B are views illustrating an operation of a surface-mount type electric connecting terminal.
Figure 16B:
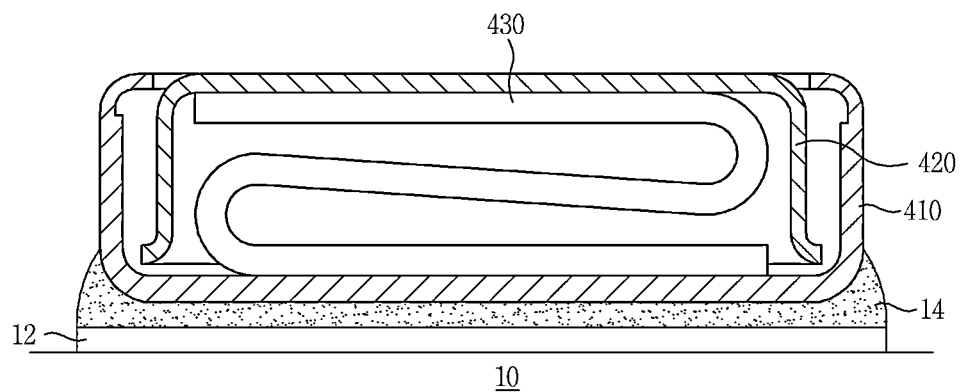

FIGS. 16A and 16B are views illustrating the operations of the electric connecting terminal.

The electric connecting terminal 400 is supplied in a state where it is reel-taped on a carrier and is aligned on the conductive pattern of the printed circuit board by vacuum picking up the upper surface of the movable member 420 and is surface-mounted by reflow soldering.

As illustrated in FIG. 16A, the electric connecting terminal 400 may be reel-taped, vacuum picked up and then surface-mounted on the conductive pattern 12 of the substrate 10 by reflow soldering using a solder cream 14.

An electrical conductive object such as an antenna, etc. presses and comes into contact with the upper surface of the electric connecting terminal 400, so the movable member 420 slides downward by the pressing pressure from the object. At this time, it slides receiving the elastic force from the flat spring 430.

Since the surface area where the contact portions 131 and 133 of the flat spring 430 come into contact with the fixed member 410 and the movable member 420 is similar with the surface area of the bottoms of the fixed member 410 and the movable member 420, the contact surface area is very large, which results in decreased contact resistance.

As the movable member 420 moves downward, the elastic transformation portion 132 of the flat spring 430 is elastically transformed. As illustrated by a dotted line by FIG. 15, the elastic transformation portion 132 contracts in the direction of its height. The elastic transformation portion 132 is elastically and uniformly transformed in a horizontal direction, so the contact portion 133 may keep horizontal during the elastic transformation procedure.

As the pressing pressure against the movable member 420 is removed, when the movable member 420 moves upward by elastic recovery force of the flat spring 430, the flange 422 of the movable member 420 is surely caught by the hook protrusion 412 of the fixed member 410, thus surely preventing the movable member 420 from being disengaged by the recovery force of the flat spring 430 in the middle of reflow soldering or when the object has plenty of movement.

In addition, the size of the fixed member 410 is determined to be larger than the size of the movable member 420, and the width of the fixed member 410 is determined to be similar with the width of the conductive pattern, so the electric connecting terminal may be stably surface-mounted on the conductive pattern of the printed circuit board, and soldering strength is good.

As described above, the above exemplary embodiment has been described assuming that the fixed member and the movable member are cylindrical shapes an end of each of which is open, and the other end is closed. Variously transformed structures may be also adapted as long as such structures are configured in such a way that the movable member is vacuum picked up, and the fixed member is soldered on the printed circuit board, and the movable member is movable upward and downward and are secured to the fixed member so as to limit the movement thereof, and the spring is disposed inside for thereby forming electrical passage.

According to the above-described structure, reflow soldering may be easily performed in a vacuum pickup process in such a way that top of the movable member is formed in a horizontally flat shape which enables a vacuum pickup work. Since the movable member is surely held by the fixed member, any disengagement of the movable member may be surely prevented in the middle of reflow soldering or even if there are plenty of movement in objects.

Also, since the movable member and the fixed member may slide against each other but may not be mechanically disengaged from each other, so the movable member may remain more reliably engaged to the fixed member when engaging them for soldering and even after soldering.

Also, the movable member is secured to the fixed member by a flange which is formed in a lower side of the movable member and is identified as the thickness of a lower side of the movable member, which makes it possible to increase a operating distance at the same height, thus manufacturing a surface-mount electric connecting terminal which has a lower height and a longer operating distance.

Also, the movable member and the fixed member both are manufactured by pressing metallic sheets, so their manufacturing is easy, and yield may be enhanced, and manufacturing cost is low.

Also, an end of the spring may be supported in the center of the bottom of the fixed member by mans of embossing which protrudes inwardly, so a coil spring housed in the fixed member may be less distorted.

Instead of using the embossing, the diameter of the portion contacting with the bottom of the fixed member of the spring may be increased and supported by an inner surface of the fixed member, whereby it is possible to prevent the distortions of the spring without embossing.

More reliable soldering may be obtained in such a way that a non-soldering region where is not easily soldered is formed in a lower surface of the fixed member because movement may less occur during the reflow soldering which is performed using solder cream.

Also, the movement of the movable member may be smoother by preventing the flange of the movable member from contacting with an inner surface of the fixed member in such a way that the interval between the flange of the movable member and an inner surface of the fixed member is determined to be longer as possible.

Also, the hardness of the material of the fixed member is lower than the hardness of the material of the movable member, so less scratch may occur on the surface of the movable member during the repeated compressions.

Also, it is possible to manufacture a structure whose height is higher as compared with the surface area of the bottom surface due to the assembled structure of the fixed member and the movable member.

Also, the total weight of the fixed member may be greater than the total weight of the movable member in such a way to adjust the thickness of the member, so movement may be less during reflow soldering because the center of gravity leans toward the bottom of the electric connecting terminal.

Also, since the electric resistance of the electrical conductive flat spring which has a predetermined thickness and a predetermined surface area determined to electrically and mechanically connect the fixed member and the movable member is smaller than that of the coil spring on which a thin metallic wire is wound, so the fixed member and the movable member may be connected with lower electric resistance.

Also, since the surface area of the contact portion of the electrical conductive flat spring is similar with the surface area of each of the fixed member and the movable member, the contact surface area increases, so the electric resistance or electric contact resistance is lowered and the at the same time, the electrical conductive flat spring may be hardly distorted.

Also, a heat-resisting elastic filler with a predetermined elasticity is filled in the fixed member and is adhered, so the force of pressing the electrical conductive flat spring and the elastic recovery force may be enhanced.

Also, the surface-mount electric connecting terminal may be stably mounted on a conductive pattern of the printed circuit board and the soldering strength may be enhanced in such a way that the size of the fixed member is determined to be larger than the size of the movable member, and the width of the quadrangular box-shaped fixed member is determined to be similar with the width of the conductive pattern.

Figure 18:
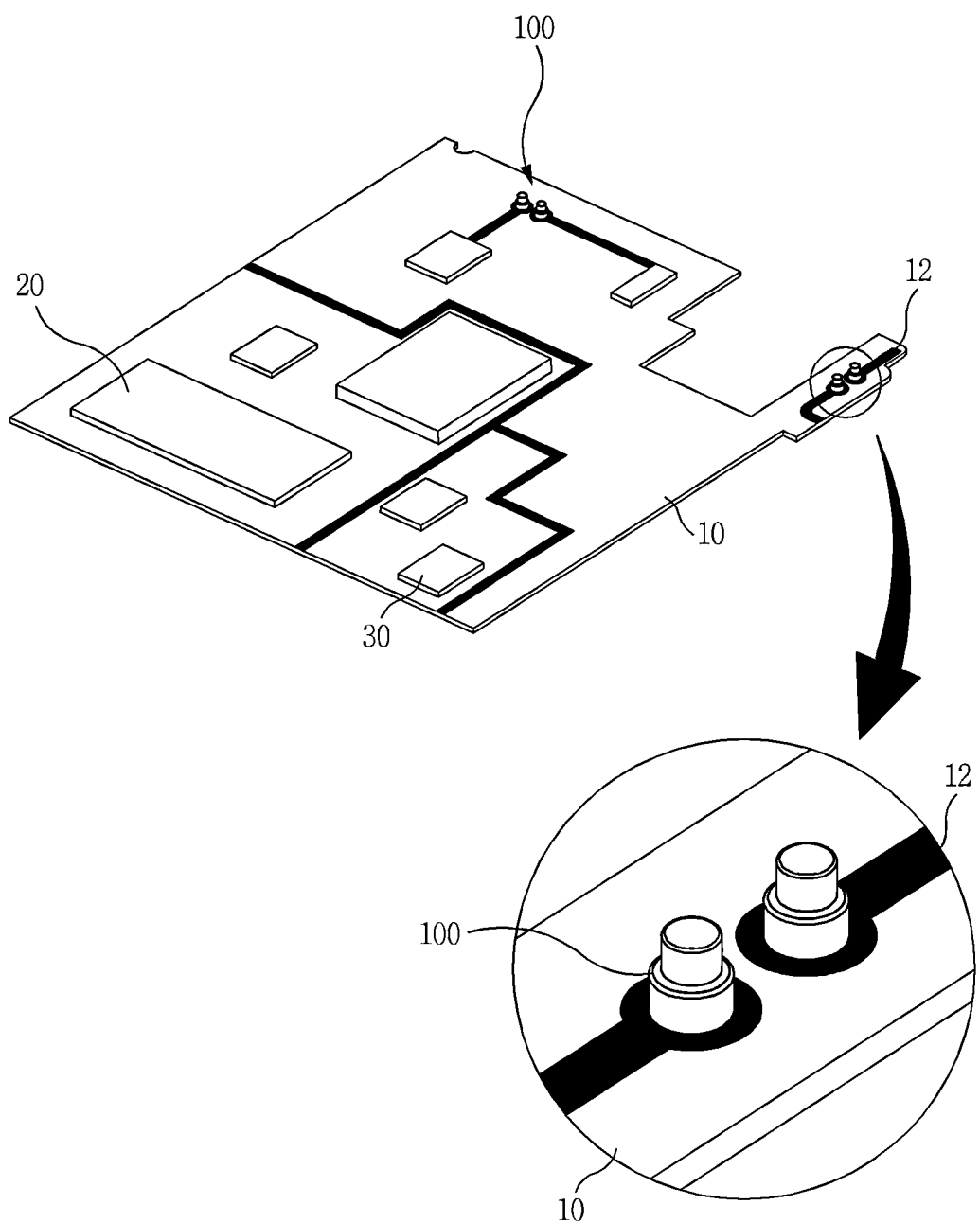
FIG. 18 is a view of a state in which a surface-mount type electric connecting terminal is mounted on a circuit board.
Figure 19:
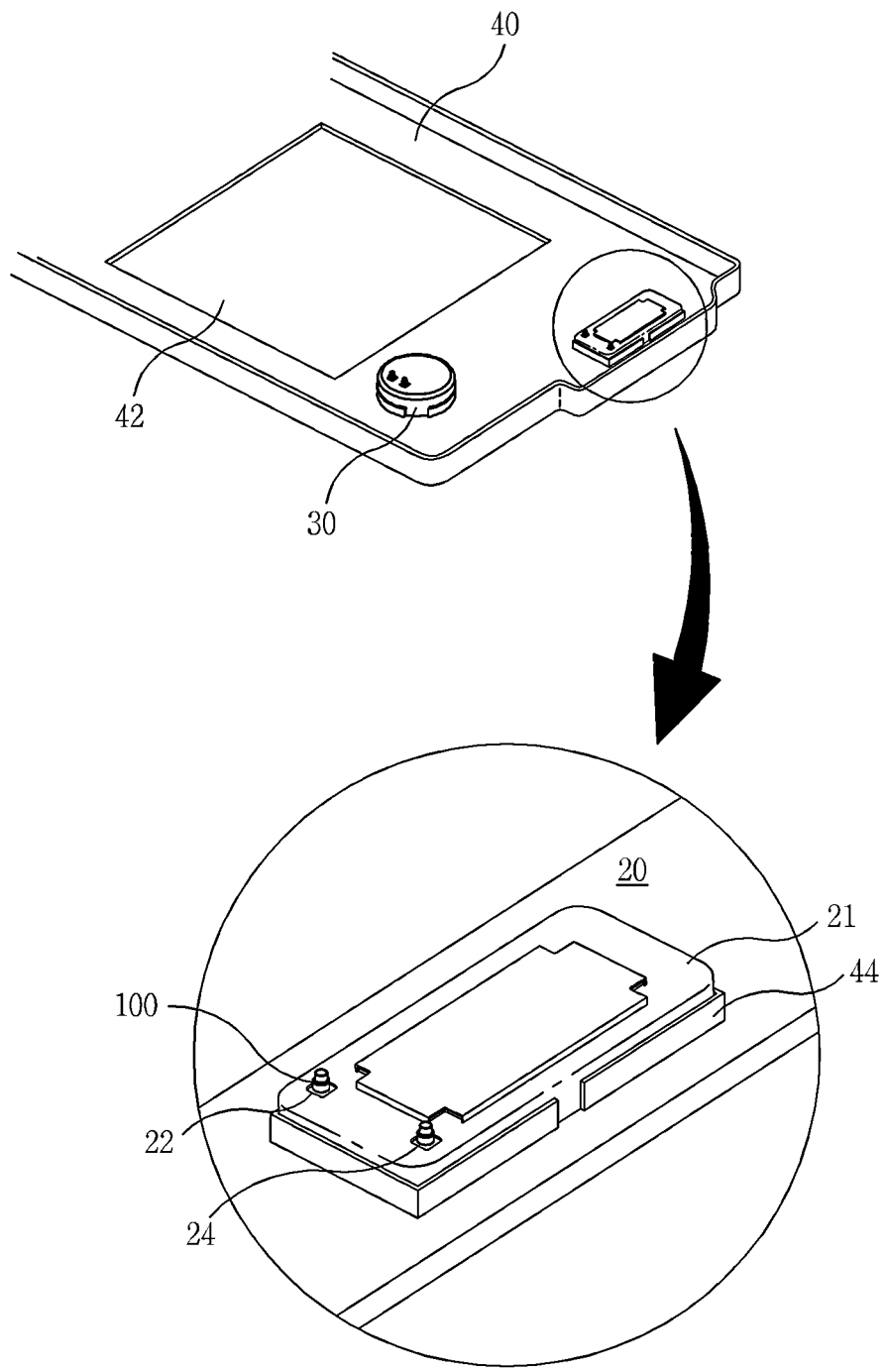
FIG. 19 is a view of a state in which an electronic module unit where the surface-mount type electric connecting terminal is mounted is installed in a housing of electronic equipment.

The surface-mount type electric connecting terminal according to the present invention according to the present invention may be variously used, and FIGS. 18 and 19 illustrate various examples in use.

FIG. 18 is a view of a state in which a surface-mount type electric connecting terminal is mounted on a circuit board.

Referring to FIG. 18, conductive patterns 12 having various shapes are disposed on a circuit board 10, and a plurality of electronic components or electronic modules 20 and 30 are mounted on the circuit board 10. The conductive patterns 12 may include a single pattern and a ground pattern. The electronic components or electronic modules 20 and 30 may be electrically connected to each other.

As shown in the enlarged view of a circle of FIG. 18, an elastic electric connecting terminal 100 electrically contacting with an external object is mounted on the conductive pattern 12, and the electric connecting terminal 100 is mounted on the circuit board 10 through surface-mount type reflow soldering.

The electric connecting terminal 100 may be mounted on the conductive pattern for grounding and thus used for anti-static electricity or electromagnetic shielding. Also, the electric connecting terminal 100 may be mounted on the conductive pattern for signal and thus used for supplying a power or signal.

Particularly, when the electric connecting terminal 100 is used for the anti-static electricity or electromagnetic shielding, the electric connecting terminals 100 may be mounted on the conductive pattern for grounding at a predetermined distance.

FIG. 19 is a view of a state in which an electronic module unit where the surface-mount type electric connecting terminal is mounted is installed in a housing of electronic equipment. Referring to FIG. 19, various electronic modules 20 and 30 may be disposed in electronic equipment or a housing 40 of the electronic equipment. Here, the electronic modules 20 and 30 may be inserted into reception ribs integrated with the housing 40. Unexplained reference number 42 denotes an opening.

The electronic module units 20 and 30 may be, for example, a speaker unit 20, a microphone unit 30, a motor unit, an antenna unit, a sensor unit, a display unit, or a camera unit, which is illustrated as an enlarged view of a circle of FIG. 19.

The speaker unit 20 having a flat square box shape may be manufactured by burying an electric device (not shown) such as a speaker into a structure 21 such as an injection-molded object. The structure 21 may be fixedly inserted into the protruding rib 44 integrated with the housing 40.

FIG. 19 illustrates a rear surface of the speaker unit 20. In addition, an acoustic output hole is defined in the housing 40 to correspond to a front surface (not shown) of the speaker unit 20.

A pair of openings 22 is defined in a rear surface of the structure 21. An input pad 24 is disposed in each of the opening 22, and the elastic electric connecting terminal 100 is mounted on the conductive input pad 24 through soldering. The present embodiment is not limited to the number of openings 22. For example, the number of openings 22 may be variously changed according to the supplying of the power or signal.

Thus, an acoustic signal may be inputted through the signal pattern of the circuit board (not shown) that elastically contacts with the elastic electric connecting terminal 100, and the inputted acoustic signal may be transmitted into the speaker through the conductive input pad 24. Then, the acoustic signal may be converted into sounds through the speaker, and the converted sound may be outputted through the speaker.

Although the conductive pad 24 formed on the structure 21 is used for inputting signals in the present embodiment, the present invention is not limited thereto. For example, the conductive pad 24 may be used for outputting signals, like the microphone unit 30. Alternatively, the conductive pad 24 may be used for inputting or outputting a power.

As a result, the elastic electric connecting terminal 100 constituting one portion of the electronic modules 20 and 30 may serve as a member for allowing the external object to electrically contact with the electric device of the electronic module units 20 and 30.

While the present invention has been described in detail, it should be understood that various changes, substitutions and alterations can be made hereto without departing from the spirit and scope of the invention as defined by the appended claims.

What is claimed is:

1. A surface-mount type electric connecting terminal, comprising:
    a cylindrical fixed member which is made from a metallic material;
    a cylindrical movable member which is slidably inserted in the fixed member and is made from a metallic material; and
    an electrical conductive spring which is accommodated in the fixed member and whose one end contacts with a bottom of the fixed member and another end contacts with a bottom of the movable member for thereby allowing the movable member to elastically slide against the fixed member,
    wherein the movable member and the fixed member always keep electrically connected by the electrical conductive spring, and a hook portion is configured to prevent the movable member from being disengaged from the fixed member when elastic recovery force is transferred from the electrical conductive spring,
    a flat surface is formed in an upper end surface of the movable member for vacuum pickup, and a lower end surface of the fixed member is configured to be reflow-soldered using solder cream, and
    wherein the lower end surface of the fixed member is slanted in an upward direction from an edge to a center thereof for thereby having a recess.

2. The terminal of claim 1, wherein the hook portion comprises:
    a hook protrusion formed by inwardly bending an edge of an opening of the fixed member; and
    a flange which extends outward in a horizontal direction along an edge of an opening of the movable member,
    wherein the thickness of the flange corresponds to the thickness of the movable member.

3. The terminal of claim 2, wherein the width of the flange is determined such that the movable member may not be disengaged from the fixed member even by elastic recovery force of the spring because the movable member is caught by the hook protrusion, and is determined such what a gap between a cross section of the flange and an inner surface of the fixed member may be maintained as large as possible.

4. The terminal of claim 1, wherein a total weight of the fixed member is determined to be heavier than a total weight of the movable member, so a center of gravity of the electric connecting terminal is positioned in the fixed member.

5. The terminal of claim 1, wherein a groove is formed at a center of the lower end surface of the fixed member, and an embossing protrudes in an inward direction from the bottom of the fixed member.

6. The terminal of claim 5, wherein the embossing is inserted in the other end of the spring.

7. The terminal of claim 1, wherein the spring has at least a larger diameter portion which contacts along an edge of the bottom of the fixed member.

8. The terminal of claim 1, wherein a non-soldering region where soldering using a solder cream is hard is formed in the lower end surface of the fixed member.

9. The terminal of claim 8, wherein the non-soldering region is coated with heat-resisting polymer resin, and the non-soldering region is formed in a circular shape in a central portion of the lower end surface of the fixed member.

10. The terminal of claim 1, wherein the fixed member and the movable member both are press process-based products manufactured in such a way to press metallic sheets through a press process.

11. The terminal of claim 1, wherein the electric connecting terminal is mounted by the vacuum pickup and is reflow-soldered using a solder cream and is surface-mounted on a printed circuit board.

12. The terminal of claim 1, wherein, in the electric connecting terminal, a filler which has elasticity and heat resistance satisfying the temperature condition of the reflow soldering is filled within a cavity between the fixed member and the movable member.

13. The terminal of claim 1, wherein the fixed member and the movable member both are longer than the widths thereof and each comprise at least a wide width portion and at least a narrow width portion which is integrate at one side of the wide width portion and has smaller width than the wide width portion, and the spring is housed in each wide width portion.

14. The terminal of claim 1, the fixed member and the movable member are box-shaped, and the spring is a plate spring.

15. The terminal of claim 14, wherein the fixed member, the movable member and the plate spring are manufactured by pressing a metallic sheet which has a predetermined thickness.

16. The terminal of claim 14, wherein the plate spring comprises a pair of contact portions which contact with the bottom of the fixed member and the bottom of the movable member, and an elastic transformation portion which is disposed between the pair of the contact portions and is configured to connect the pair of the contact portions and is elastically transformed by external pressure.

17. An electronic module unit disposed and fixed to a housing of electronic equipment and comprising an electronic device coupled to a structure, the electronic module unit comprising:
at least one conductive input/output pad disposed on the structure, the at least one conductive input/output pad being electrically connected to the electronic device; and
the surface-mount type electric connecting terminal as recited in claim 1, which is mounted on the conductive input/output pad through soldering.

18. A circuit board on which a plurality of electronic components or electronic modules are mounted on a conductive pattern having various shapes to allow the electronic components or electronic modules to be electrically connected to the conductive pattern, the circuit board comprising:
the surface-mount type electric connecting terminal as recited in claim 1, which is electrically connecting the conductive pattern to an external object.

* * * * *